(12) United States Patent
Gossner et al.

(10) Patent No.: US 8,455,949 B2
(45) Date of Patent: Jun. 4, 2013

(54) ESD PROTECTION ELEMENT AND ESD PROTECTION DEVICE FOR USE IN AN ELECTRICAL CIRCUIT

(75) Inventors: Harald Gossner, Riemerling (DE); Christian Russ, Diedorf (DE)

(73) Assignee: Infineon Technologies AG, Neubiberg (DE)

( * ) Notice: Subject to any disclaimer, the term of this patent is extended or adjusted under 35 U.S.C. 154(b) by 970 days.

(21) Appl. No.: 11/803,169

(22) Filed: May 11, 2007

(65) Prior Publication Data

US 2007/0262386 A1 Nov. 15, 2007

(30) Foreign Application Priority Data

May 11, 2006 (DE) .......................... 10 2006 022 105

(51) Int. Cl.
*H01L 29/78* (2006.01)
(52) U.S. Cl.
USPC .................................. 257/355; 257/E29.181
(58) Field of Classification Search
USPC ................... 257/355–360, 111, 173, E29.181
See application file for complete search history.

(56) References Cited

U.S. PATENT DOCUMENTS

| | | | | |
|---|---|---|---|---|
| 4,231,055 A * | 10/1980 | Iizuka | ............................ | 257/369 |
| 4,282,556 A * | 8/1981 | Ipri | ................................ | 361/56 |
| 5,465,189 A | 11/1995 | Polgreen et al. | | |
| 5,652,455 A * | 7/1997 | Zambrano | ..................... | 257/360 |
| 5,991,134 A * | 11/1999 | Tan et al. | ......................... | 361/56 |
| 6,118,154 A * | 9/2000 | Yamaguchi et al. | .......... | 257/360 |
| 6,242,763 B1 * | 6/2001 | Chen et al. | ..................... | 257/107 |
| 6,388,292 B1 * | 5/2002 | Lin | ................................ | 257/356 |
| 6,573,566 B2 * | 6/2003 | Ker et al. | ....................... | 257/355 |
| 6,642,088 B1 | 11/2003 | Yu | | |
| 6,750,515 B2 | 6/2004 | Ker et al. | | |
| 6,768,619 B2 | 7/2004 | Ker et al. | | |
| 6,894,351 B2 * | 5/2005 | Okawa et al. | .................. | 257/347 |
| 7,173,310 B2 * | 2/2007 | Voldman et al. | .............. | 257/350 |
| 2006/0065933 A1 * | 3/2006 | Chu et al. | ....................... | 257/355 |

FOREIGN PATENT DOCUMENTS

EP 0 852 400 A2 7/1998
WO WO 2004/051749 A1 6/2004

OTHER PUBLICATIONS

Olivier Marichal, et al, "*SCR based ESD protection in nanometer SOI technologies*", 2005 EOS/ESD Symposium, Copyright 2005 © by ESD Association, pp. 2-9.
Ajith Amerasekera, *Physics and Operation of ESD Protection Circuit Elements*, ESD in Silicon Integrated Circuits, $2^{nd}$ Edition, Copyright © 2002 John Wiley & Sons, Ltd., ISBNs: 0-471-49871-8 (Hardback): 0-470-84605-4 (Electronic), pp. 68-104.

* cited by examiner

*Primary Examiner* — Matthew W Such
*Assistant Examiner* — Ali Naraghi

(57) ABSTRACT

An ESD protection element for use in an electrical circuit having a fin structure or a fully depleted silicon-on-insulator structure. The fin structure or the fully depleted silicon-on-insulator structure contains a first connection region having a first conductivity type; a second connection region having a second conductivity type, which is opposite to the first conductivity type; and also a plurality of body regions which are formed alongside one another and which are formed between the first connection region and the second connection region. The body regions alternately have the first conductivity type and the second conductivity type. The ESD protection element has at least one gate region formed on or above at least one of the plurality of body regions, and also at least one gate control device which is electrically coupled to the at least one gate region.

20 Claims, 15 Drawing Sheets

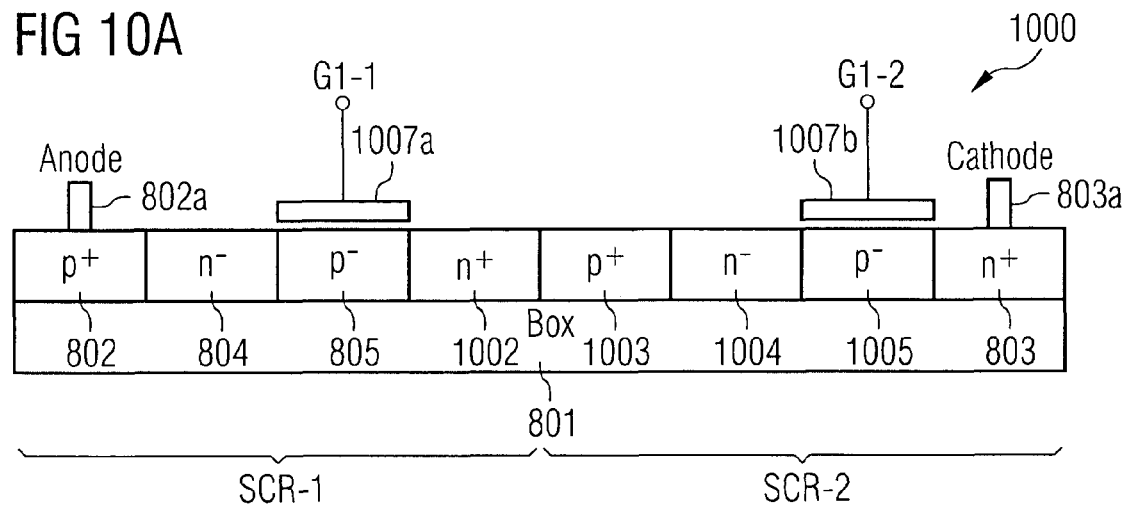
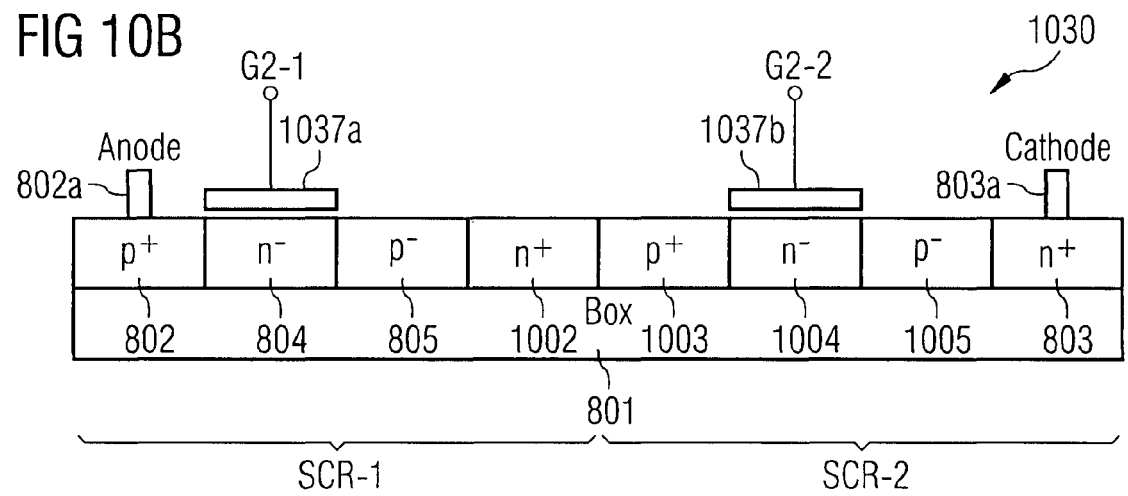

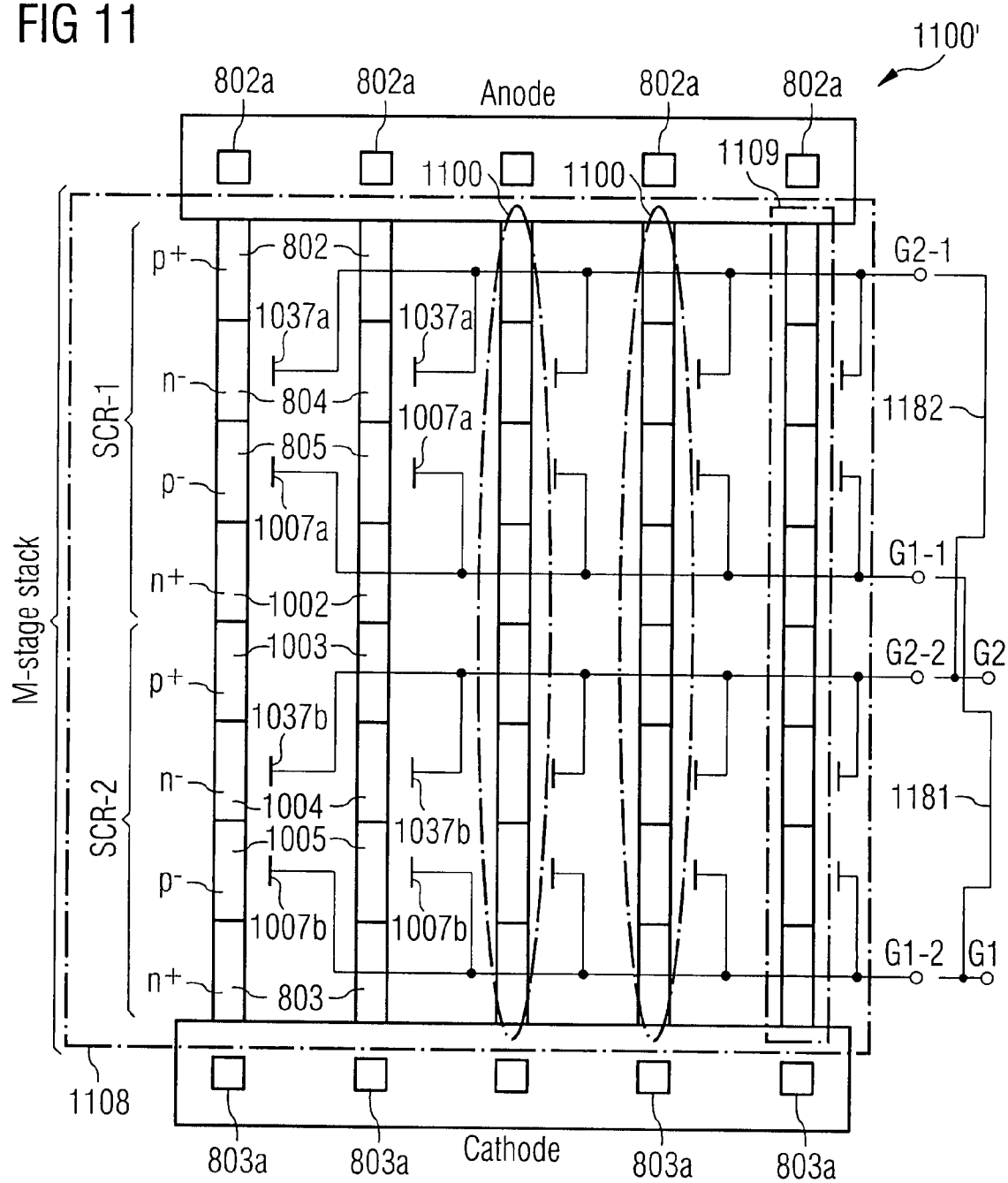

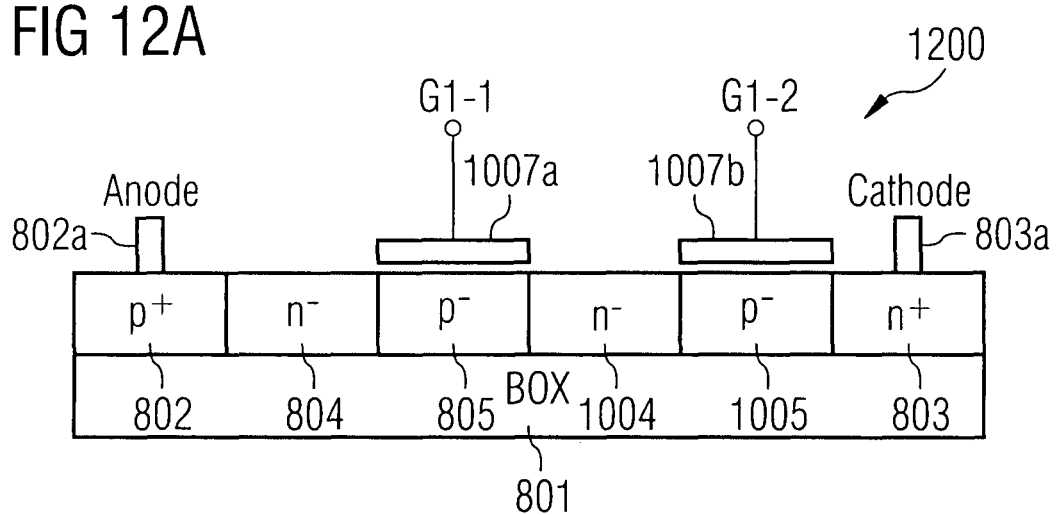
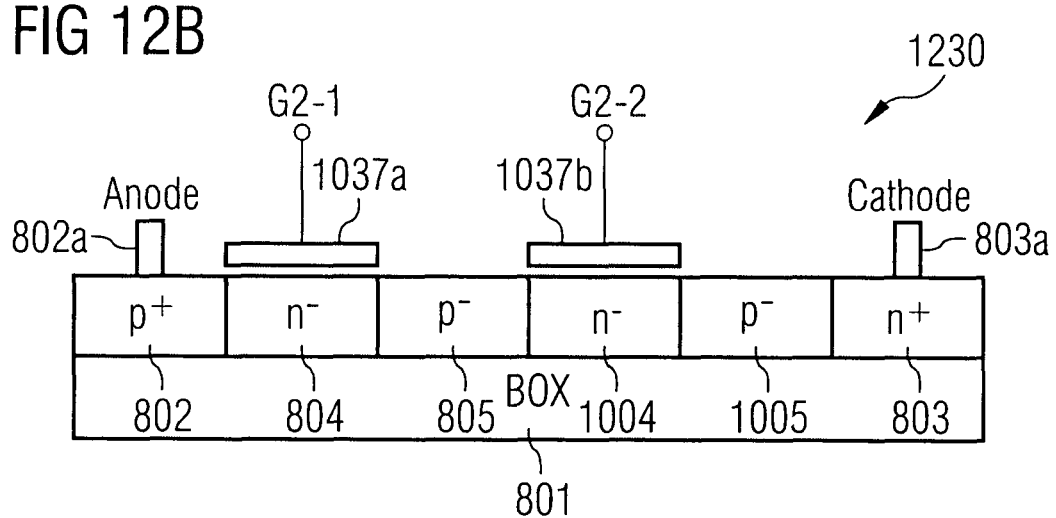

ESD PROTECTION ELEMENT AND ESD PROTECTION DEVICE FOR USE IN AN ELECTRICAL CIRCUIT

This application claims priority to German Patent Application DE 10 2006 022 105.2 filed May 11, 2006, which is incorporated herein in their entirety by reference.

BACKGROUND OF THE INVENTION

The invention relates to an electrostatic discharge (ESD) protection element and an ESD protection device for use in an electrical circuit.

It is desirable to provide ESD protection elements for advanced process technologies such as, for example, FD-SOI technologies or FinFET or MuGFET technologies. Such ESD protection elements can help reduce or eliminate damage to electrical circuits due to buildup of static electricity or due to other sudden discharge. Abnormal voltages are safely discharged to ground or another reference level, preserving the functionality of the electrical circuits.

BRIEF SUMMARY OF THE INVENTION

An ESD protection element for use in an electrical circuit having a fin structure or a fully depleted silicon-on-insulator structure is provided. The fin structure or the fully depleted silicon-on-insulator structure contains a first connection region having a first conductivity type; a second connection region having a second conductivity type, which is opposite to the first conductivity type; and also a plurality of body regions which are formed alongside one another and which are formed between the first connection region and the second connection region. The body regions alternately have the first conductivity type and the second conductivity type. The ESD protection element has at least one gate region formed on or above at least one of the plurality of body regions, and also at least one gate control device which is electrically coupled to the at least one gate region and which is set up in such a way that at least one electrical potential applied to the at least one gate region can be controlled.

BRIEF DESCRIPTION OF THE DRAWINGS

In the drawings, identical reference symbols generally designate the same constituent parts throughout the various views. The drawings are not necessarily true to scale. The main emphasis is instead generally put on illustrating the principles of the invention. In the description below, various exemplary embodiments of the invention are described with reference to the following drawings, in which:

FIG. 10A shows a cross-sectional view of an ESD protection element in accordance with another exemplary embodiment of the invention;

FIG. 10B shows a cross-sectional view of an ESD protection element in accordance with another exemplary embodiment of the invention;

FIG. 11 shows a layout illustration of an ESD protection device in accordance with another exemplary embodiment of the invention;

FIG. 12A shows a cross-sectional view of an ESD protection element in accordance with another exemplary embodiment of the invention;

FIG. 12B shows a cross-sectional view of an ESD protection element in accordance with another exemplary embodiment of the invention;

DETAILED DESCRIPTION OF THE INVENTION

Electrostatic discharges (ESD) constitute a permanent threat to integrated circuits (IC). An ESD event involves the occurrence of short electrical discharge pulses during which high electrical currents flow or high electrical voltages occur. Protection against electrostatic discharges or ESD events may be necessary for many electronic components.

Particularly with the use of advanced process technologies such as e.g. FD-SOI technologies (fully depleted silicon on insulator=silicon-on-insulator structure fully depleted of charge carriers) or FinFET (Fin Field Effect Transistor=field effect transistor having a fin structure) or MuGFET technologies (Multi-Gate Field Effect Transistor=field effect transistor having a fin structure in which a channel region is driven from at least two sides with the aid of a plurality of gates), the development of efficient ESD protection mechanisms constitutes a growing challenge in view of the ever shrinking dimensions of the electronic components and the associated increasing sensitivity towards electrical overvoltages.

In order to protect an integrated circuit against damage caused by electrostatic discharges, ESD protection elements have to be installed at each input/output connection (I/O pad) and at each supply connection (supply pad) of the IC. These protection elements turn on immediately as soon as a discharge occurs, and effectively limit the voltage overshoot, that is to say the overshooting of a critical voltage value. At the same time, they should themselves not be damaged by the discharge, which forces electrical currents having a current intensity of several amperes through the I/O devices and protection devices.

One known efficient ESD protection element is a thyristor (silicon controlled rectifier, SCR). It comprises an $n^+$-type contact region and a $p^+$-type contact region and also two mutually adjoining lightly doped regions having different conductivity types (i.e. a weakly p-doped region and a weakly n-doped region) in between, which are arranged in such a way that a pnpn four-layer structure with three pn junctions results.

Figure 1:
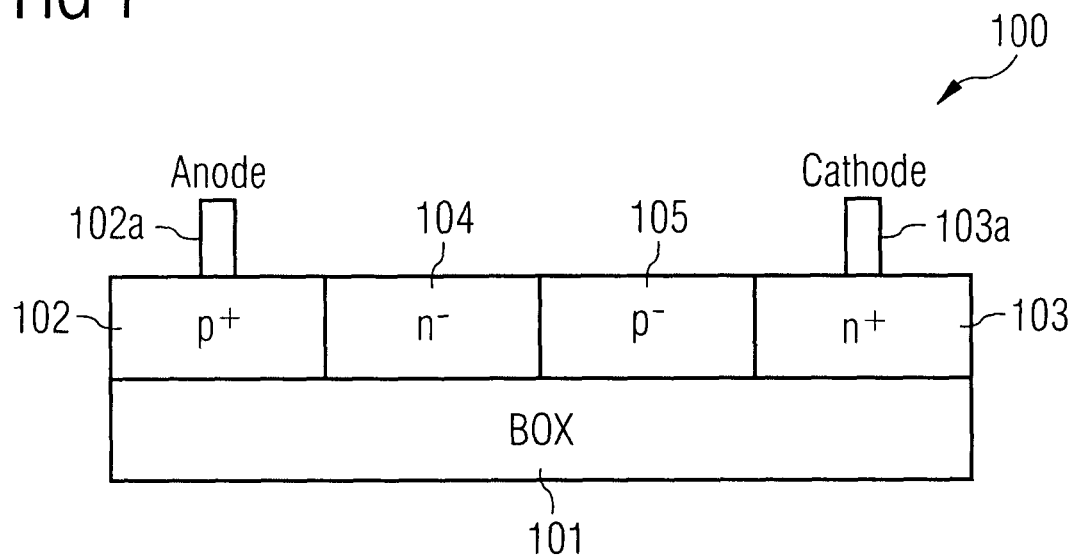
FIG. 1 shows a cross-sectional view of one SOI-SCR structure.

FIG. 1 shows by way of example a schematic cross-sectional view of a SCR 100, realized in an SOI technology. A heavily p-doped (P+) first contact region 102 and a heavily n-doped (N+) second contact region 103 are formed on a buried oxide layer 101 (buried oxide, BOX) of the SCR 100. Electrical contact is made with the first contact region 102 by means of a first electrical contact 102a, and electrical contact is made with the second contact region 103 by means of a second electrical contact 103a. The first contact region 102 and the first electrical contact 102a form an anode (identified by "Anode" in FIG. 1) of the SCR 100, while the second contact region 103 and the second electrical contact 103a form a cathode of the SCR 100 (identified by "Cathode" in FIG. 1). A weakly n-doped (N−) first body region 104 and a weakly p-doped (P−) second body region 105 are formed between the first contact region 102 and the second contact region 103.

Clearly the SCR 100 can be interpreted as two mutually interlaced bipolar transistors of different types, that is to say that a pnp transistor (formed from the first contact region 102 (P+), the first body region 104 (N−) and the second body region 105 (P−)) and an npn transistor (formed from the first body region 104 (N−), the second body region 105 (P−) and the second contact region 103 (N+)), the collector of the pnp transistor forming the base of the npn transistor, and vice versa.

Although a thyristor or SCR is very robust with regard to the discharge current and enables a low clamping voltage even at high current levels, in the development of an SCR-based ESD protection element typically the challenge consists in attaining a trigger voltage Vt1 of the SCR that is low enough to protect a circuit connected in parallel with the SCR.

In bulk CMOS technologies (CMOS: Complementary Metal Oxide Semiconductor), for example LVTSCRs (Low Voltage Triggered SCR), that is to say SCRs having a low trigger voltage Vt1, or externally triggered SCRs (e.g. Diode Triggered Silicon Controlled Rectifier, DTSCR) are available as a solution for this.

A brief overview of ESD protection devices based on SCR elements is given below with reference to FIGS. 2 to 5B.

Figure 2:
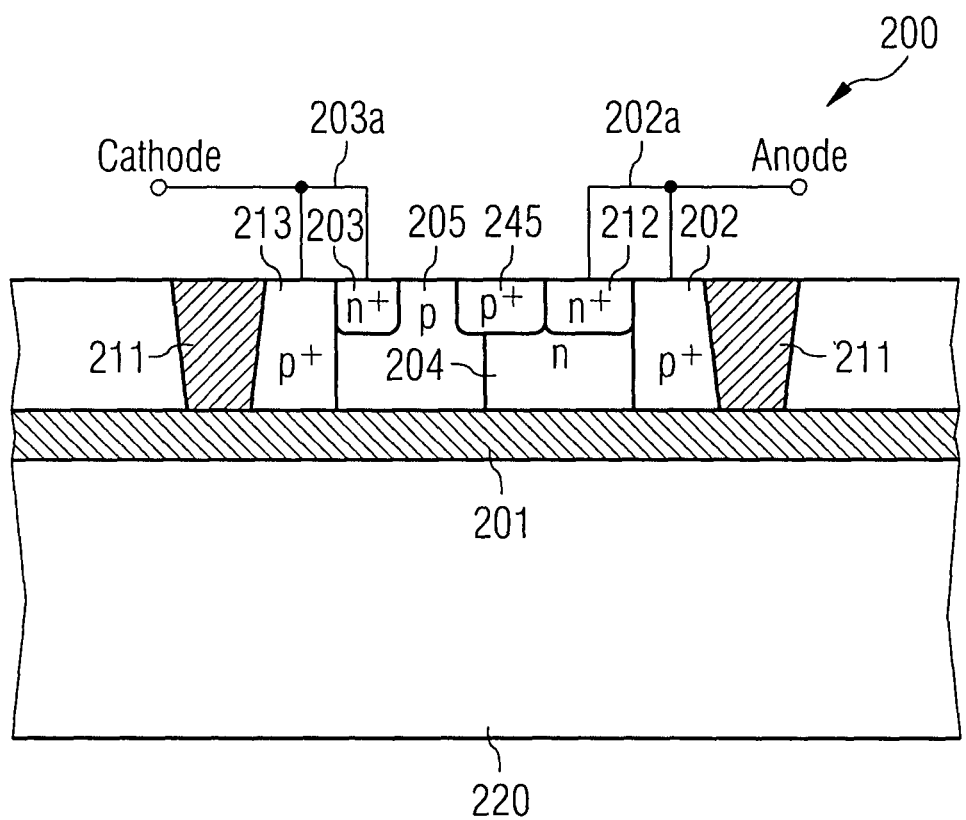
FIG. 2 shows a cross-sectional view of one SOI-LVTSCR structure.

FIG. 2 shows a cross-sectional view of a SCR 200 having a low trigger voltage, that is to say an LVTSCR (Low Voltage Triggered SCR). The low trigger voltage is attained with the aid of a $P^+$-type trigger diffusion region 245 inserted into a four-layer SCR structure (comprising a $P^+$-type anode 202, an N-type well region 204, a P-type well region 205 and an $N^+$-type cathode 203 formed in the P-type well region 205) formed on a buried oxide layer (buried oxide, BOX) 201. An $N^+$-type region 212 is formed in the N-type well region 204, electrical contact being made with the $N^+$-type region 212 and the $P^+$-type anode 202 by means of a common first electrical contact 202a. A $P^+$-type region 213 is formed alongside the P-type well region 205 and alongside the $N^+$-type cathode 203, electrical contact being made with the $P^+$-type region 213 and the $N^+$-type cathode 203 by means of a common second electrical contact 203a. The SCR structure 200 is laterally insulated by STI regions 211 (Shallow Trench Isolation) and the buried oxide layer 201 is formed on a silicon substrate 220.

The trigger diffusion is based on the low breakdown voltage that occurs at the pn junction between the $N^+$-type region 212 formed in the N-type well region 204 and the $P^+$-type trigger diffusion region 245.

One effect of the SCR 200 shown in FIG. 2 a device which displays a high leakage current and which may have a virtually low-impedance device characteristic.

A further effect is that the SCR 200 has a relatively large lateral distance between the $P^+$-type anode diffusion region 202 and the $N^+$-type cathode diffusion region 203, which leads to a relatively long turn-on time of the SCR 200 and consequently to the fact that the SCR structure 200 shown is rather unsuitable as an ESD protection element since a very short response time of an ESD protection element is normally necessary in the case of ESD events. Furthermore, a process-technological realization of the SCR 200 is highly complicated since two kinds of highly doped zones are necessary for $N^+$ and $P^+$ in each case (respectively a shallow and a deep doping).

Independently of the abovementioned effects of the SCR 200, the cross-sectional structure 200 described cannot be realized in an FD-SOI technology or MuGFET technology.

Figure 3A:
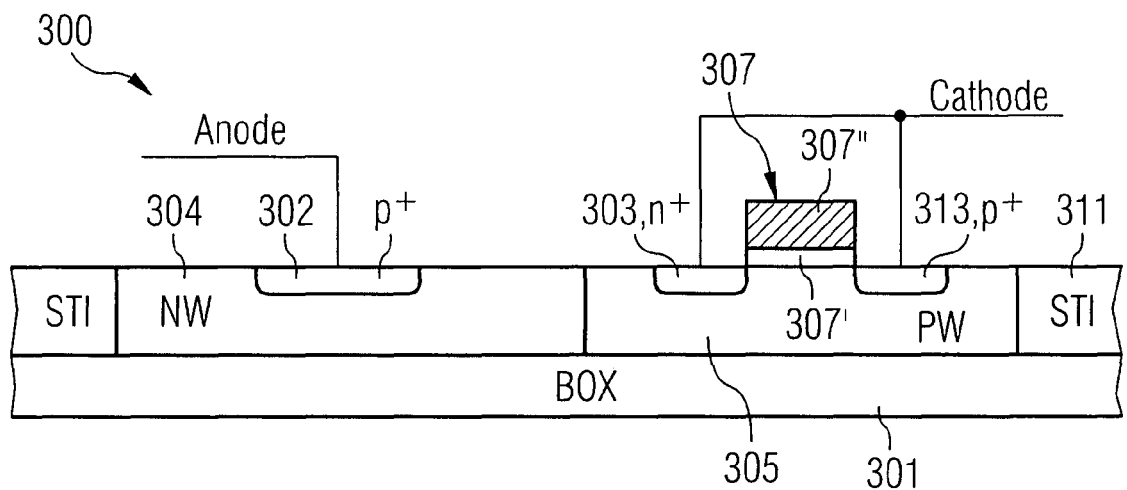
FIG. 3A shows a cross-sectional view of another SOI-SCR structure.

FIG. 3A shows a cross section of another SOI-SCR structure 300, which has on a buried oxide layer (BOX) 301 and laterally bounded by STI regions 311 an N-type well region 304 (NW) and a P-type well region 305 (PW) formed alongside the N-type well region 304. A heavily p-doped (p+) anode diffusion region 302 is formed in the N-type well region 304, and electrical contact is made with said anode diffusion region by means of an electrical contact "ANODE". A heavily n-doped (n+) cathode diffusion region 303 and a heavily p-doped (p+) region 313 are formed in the P-type well region 305, and electrical contact is made with them by means of a common electrical contact "CATHODE". Furthermore a gate 307 is formed on the P-type well region 305, said gate having an electrically insulating layer 307' and an electrically conductive layer 307" formed on the electrically insulating layer 307', the gate 307 being formed between the cathode diffusion region 303 and the heavily p-doped region 313.

In the case of the SCR structure 300 shown in FIG. 3A, the effect of the slow reaction time described in connection with FIG. 2 is overcome by virtue of the fact that the $P^+$-type anode 302 and the $N^+$-type cathode 303 have a smaller lateral distance. However, the trigger voltage is relatively high in this case, too, on account of the high breakdown voltage at the pn junction between the N-type well region 304 and the P-type well region 305.

Figure 3B:
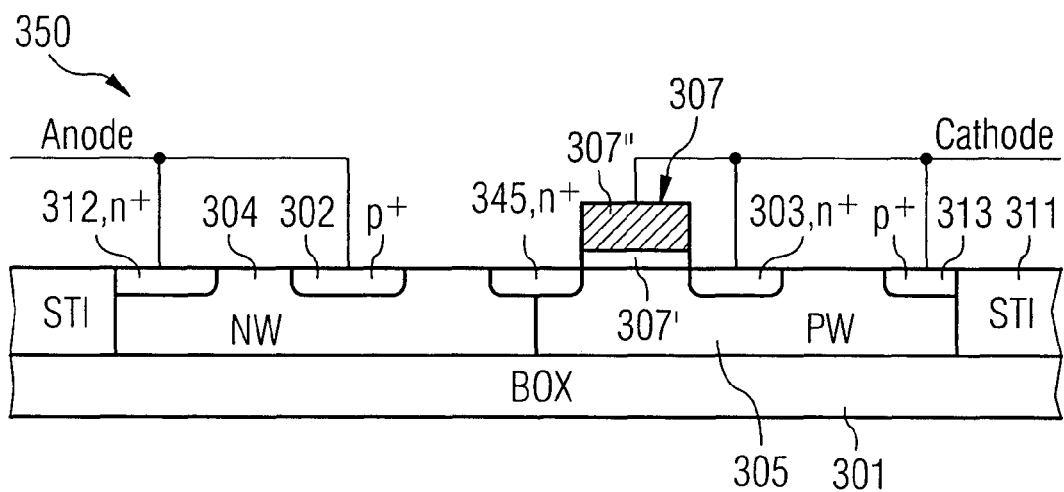
FIG. 3B shows a cross-sectional view of another SOI-LVTSCR structure.

The trigger voltage of the SCR 300 shown in FIG. 3A can be reduced (as is known from CMOS bulk technologies) by applying the standard LVTSCR structure to the SOI structure of the SCR 300, which is shown in FIG. 3B.

FIG. 3B shows an SOI-LVTSCR 350 (that is to say an SOI-based SCR having a low trigger voltage), which differs from the SOI-SCR 300 from FIG. 3A essentially by virtue of the fact that i) a first heavily n-doped (n+) region 312 is formed in addition to the (p+) anode diffusion region 302 in the N-type well region 304, electrical contact being made with the anode diffusion region 302 and the first heavily n-doped region 312 jointly by means of the electrical contact "ANODE", that ii) a second heavily n-doped (n+) region 345 is formed in an upper partial region of the junction between the N-type well region 304 and the P-type well region 305, that iii) the gate 307 formed on the P-type well region 305 is formed between the second heavily n-doped region 345 and the (n+) cathode diffusion region 303, and that iv) electrical contact is made with the gate 307 by means of the electrical contact "CATHODE".

In comparison with the SOI-SCR 300 shown in FIG. 3A, the SOI-LVTSCR 350 shown in FIG. 3B has larger internal distances (e.g. between the (p+) anode diffusion region 302 and the (n+) cathode diffusion region 303), which once again (in a manner similar to that in the case of the SCR 200 described in connection with FIG. 2), leads to an increased reaction time of the SCR 350.

In the same way as the SCR 200 shown in FIG. 2, the SCR 300 illustrated in FIG. 3A and the LVTSCR 350 illustrated in FIG. 3B also cannot be realized in an FD-SOI technology or a MuGFET technology. This is because in an FD-SOI technology (or MuGFET technology), the highly doped (N+ and P+) contact regions extend down as far as the buried oxide layer (BOX), with the result that no well contacts can be realized.

Figure 4A:
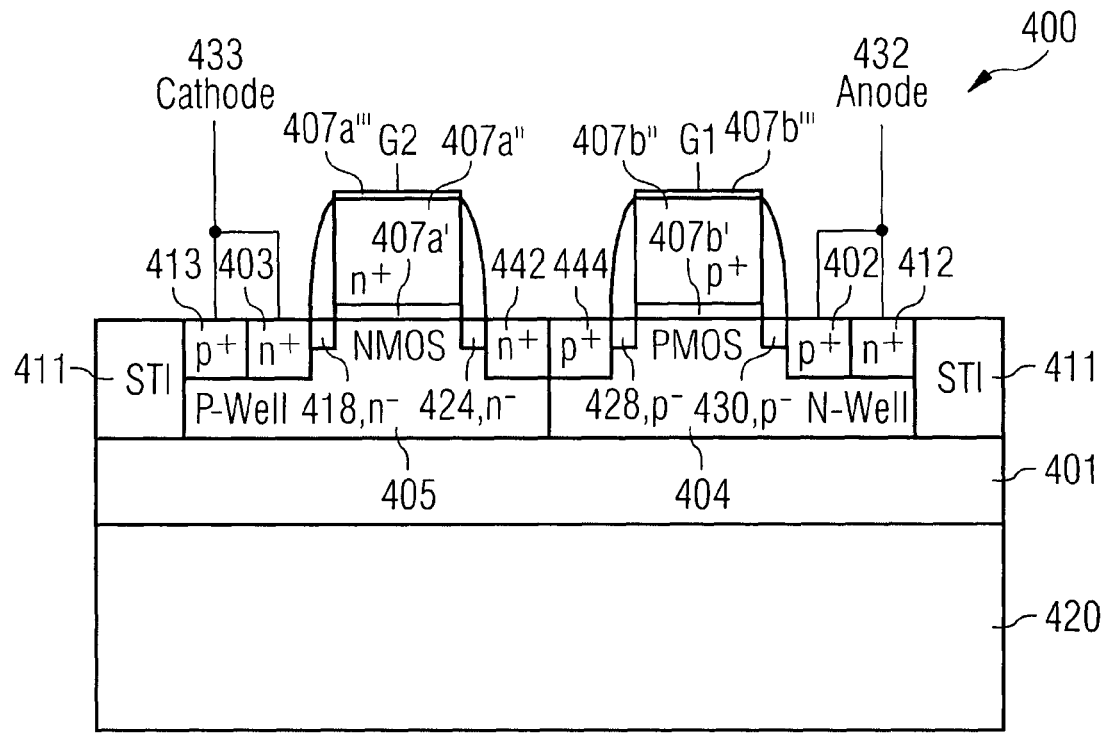
FIG. 4A shows a cross-sectional view of another SOI-LVTSCR structure.

FIG. 4A shows a cross-sectional view of another LVTSCR device 400. The LVTSCR device 400 shown is formed by means of a PD-SOI-CMOS process (PD-SOI: Partially Depleted Silicon on Insulator=silicon-on-insulator structure partially depleted of charge carriers) and has a buried oxide layer 401 formed on a semiconductor substrate 420. A layer made of silicon material (not numbered) is formed above the oxide layer 401 and has an N-type well region 404 (N-WELL) and also a P-type well region 405 (P-WELL) adjoining the N-type well region 404.

A first heavily doped p-type partial region 413 and a first heavily doped n-type partial region 403 are formed in the P-type well region 405 and are spatially separated from the oxide layer 401. The first p-type partial region 413 has a dopant concentration that is higher than that of the P-type well region 405.

A second heavily doped p-type partial region 402 and a second heavily doped n-type partial region 412 are formed in the N-type well region 404 and are spatially separated from the oxide layer 401. The second n-type partial region 412 has a dopant concentration that is higher than that of the N-type well region 404.

The second p-type partial region 402, the N-type well region 404, the P-type well region 405 and the first n-type partial region 403 together form an SCR structure. The first p-type partial region 413 and the first n-type partial region 403 form a cathode 433 ("CATHODE") of the SCR device 400, while the second p-type partial region 402 and the second n-type partial region 412 form an anode 432 ("ANODE") of the SCR device 400. Both the cathode 433 and the anode 432 receive an ESD current.

A third n-type partial region 442 is formed in the P-type well region 405 and is spatially separated from the first n-type partial region 403, the first n-type partial region 403 and the third n-type partial region 442 in each case defining a source/drain region of an NMOS transistor (not numbered). The NMOS transistor furthermore has a fourth n-type partial region 418 and a fifth n-type partial region 424. The first n-type partial region 403 has a higher dopant concentration than the fourth n-type partial region 418 and forms together with the latter a first source/drain region of the NMOS transistor. The third n-type partial region 442 has a higher dopant concentration than the fifth n-type partial region 424 and forms together with the latter a second source/drain region of the NMOS transistor. The NMOS transistor furthermore has a gate oxide 407a' formed above the P-type well region 405. The NMOS transistor furthermore has a gate 407a" formed above the gate oxide 407a' and between the n-type partial regions 418 and 424, and also a conductive polycide layer 407a''' formed above the gate 407a". Furthermore, sidewall spacers (not numbered) are formed on the sides of the gate 407a". In a similar manner, a third p-type partial region 444 is formed in the N-type well region 404 and is spatially separated from the second p-type partial region 402, the second p-type partial region 402 and the third p-type partial region 444 in each case defining a source/drain region of a PMOS transistor (not numbered).

The PMOS transistor has a fourth p-type partial region 428 and a fifth p-type partial region 430. The third p-type partial region 444 has a higher dopant concentration than the fourth p-type partial region 428 and forms together with the latter a first source/drain region of the PMOS transistor. The second p-type partial region 402 has a higher dopant concentration than the fifth p-type partial region 430 and forms together with the latter a second source/drain region of the PMOS transistor. The PMOS transistor furthermore has a gate oxide 407b' formed above the N-type well region 404. The PMOS transistor additionally has a gate 407b" formed above the gate oxide 407b' and between the p-type partial regions 428 and 430, and a polycide 407b''' is formed above the gate 407b". Furthermore, sidewall spacers (not numbered) are formed on the sides of the gate 407b". The LVTSCR device 400 is laterally electrically insulated by shallow trench isolation regions 411 (STI) formed on the oxide layer 401.

Figure 4B:
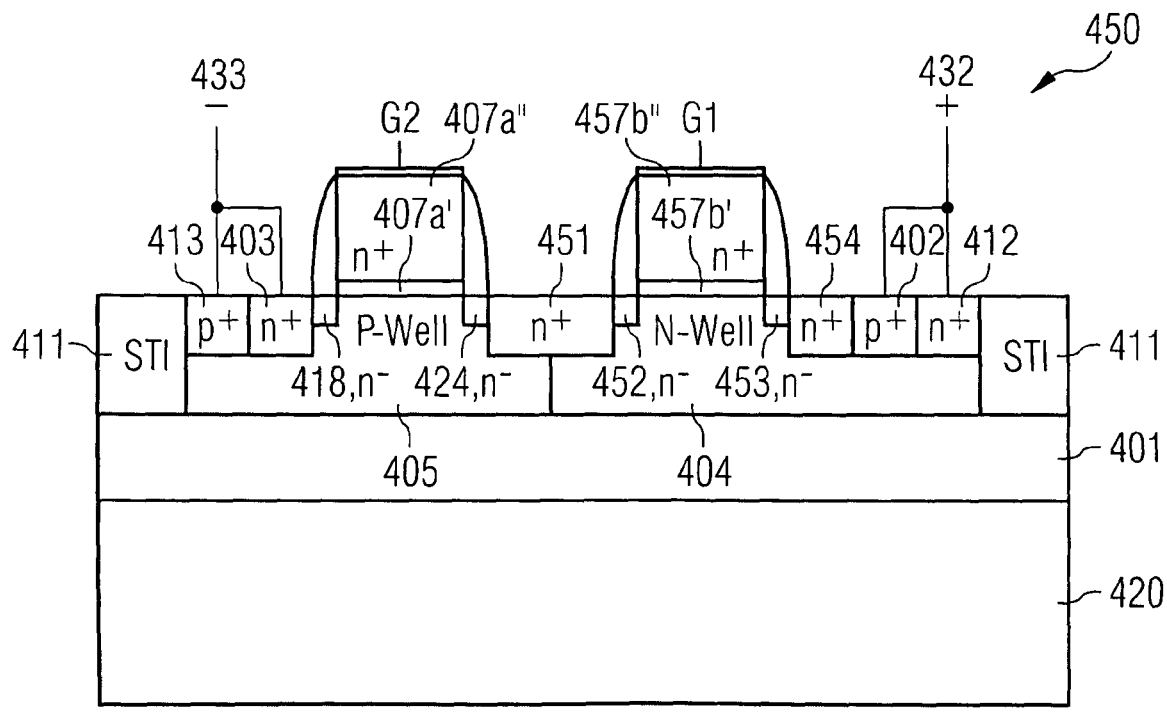
FIG. 4B shows a cross-sectional view of another SOI-LVTSCR structure.

FIG. 4B shows a cross-sectional view of another LVTSCR device 450, which differs from the LVTSCR device 400 shown in FIG. 4A essentially by virtue of the fact that the PMOS transistor formed in the N-type well region 404 of the LVTSCR device 400 is clearly replaced by an NMOS transistor in the LVTSCR device 450. The NMOS transistor has a first source/drain region (formed from an (N+) region 451 and an (N−) region 452), a second source/drain region (formed from an (N+) region 454 and an (N−) region 453), and also a gate region (having a gate oxide 457b', and a gate 457b"). The (N+) region 451 formed between the two gates of the LVTSCR device 450 serves both (together with the (N−) region 424) as second source/drain region of the NMOS transistor formed in the P-type well region 405 and (together with the (N−) region 452) as first source/drain region of the NMOS transistor formed in the N-type well region 404.

In the case of the LVTSCR devices 400 and 450 shown in FIG. 4A and FIG. 48, respectively, the trigger voltage is reduced by an ESD detector and downstream buffer stages. In a manner similar to that in the case of a bulk CMOS technology, in the case of the devices shown, the rising edge of an ESD pulse is used to trigger the SCR structures of the LVTSCR devices 400 and 450 (with the aid of the gate contacts G1 and G2). The intrinsic SCR structures of the LVTSCR devices 400 and 450 are in each case composed of the N-type well region (N-well) 404, the P-type well region (P-well) 405, and highly doped diffusion regions 402 and 403, which are spatially separated by MOS gates.

As in the case of the SCR devices 200 and 350 described in connection with FIG. 2 and FIG. 3B, respectively, the comparatively large distances between the anode region 432 and the cathode region 433 may have the effect that the LVTSCR devices 400 and 450 have a non-optimal trigger time.

Furthermore, the body contacts of the devices shown in FIG. 4A and FIG. 4B cannot be realized in an FD-SOI technology or a MuGFET technology. The (N+) region 451 between the gates that is shown in FIG. 4B reduces the bipolar gain and prevents the regenerative behavior (or the positive feedback) of the SCR 450, which leads to an unfavourable ESD behaviour.

Figure 5A:
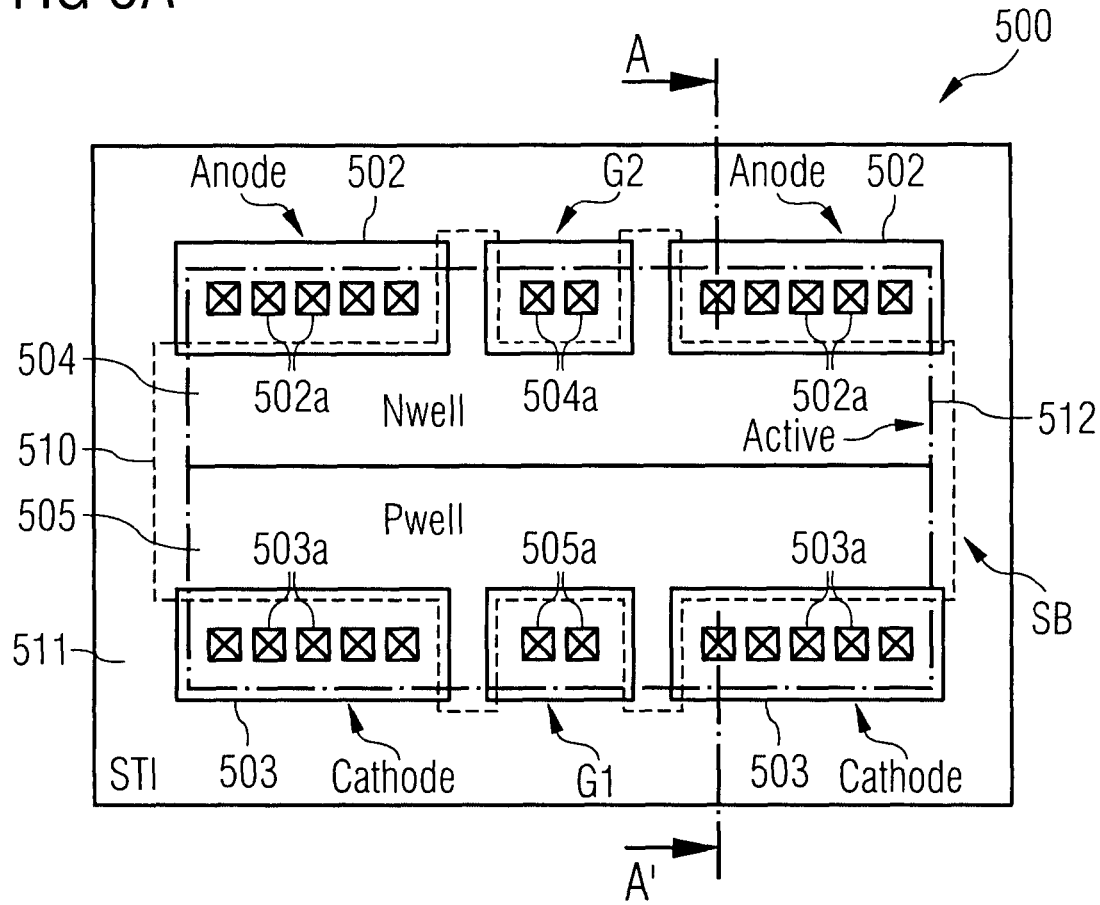
FIG. 5A shows a SCR layout based on an SOI technology.
Figure 5B:
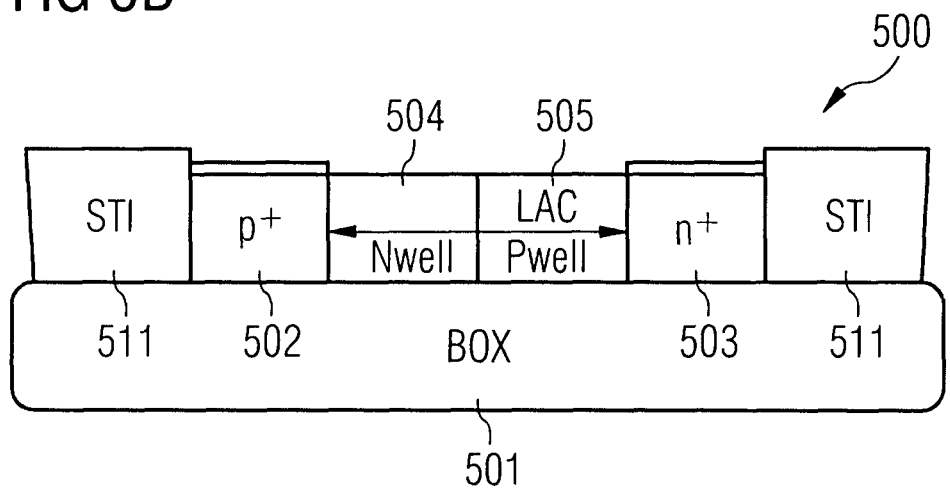
FIG. 5B shows a cross-sectional view of the SCR shown in FIG. 5A.

FIG. 5A shows a layout of a SCR 500, based on a PD-SOI technology, and FIG. 5B shows a cross-sectional view of the SCR 500 along the dashed line A-A' illustrated in FIG. 5A. An active region 512 (the SCR region) is defined on a buried oxide layer (BOX) 501, said active region being laterally electrically insulated by a shallow trench isolation 511 (STI). The active region 512 has two heavily p-doped (P+) anode segments 502, with which electrical contact is made by means of a plurality of first electrical contacts 502a, and also two heavily n-doped (N+) cathode segments 503, with which electrical contact is made by means of a plurality of second electrical contacts 503a. The distance between anode 502 and cathode 503 is identified by the double-headed arrow designated by LAC in FIG. 4B. The SCR 500 furthermore has an N-type well region 504 (Nwell) and an adjoining P-type well region 505 (Pwell), which are formed in the active region 512 between anode 502 and cathode 503. Electrical contact is made with the N-type well region 504 by means of a first trigger tap G2 which is formed between the two anode segments 502 and which has two third electrical contacts 504a, and electrical contact is made with the P-type well region 505 by means of a second trigger tap G1, which is formed between the two cathode segments 503 and which has two fourth electrical contacts 505a. During the production of the SCR 500 shown in FIG. 5A and FIG. 5B, a siliciding is blocked in the region 510 identified by the arrow SB in order to prevent a short circuit between anode 502 and cathode 503.

A realization of the PD-SOI-SCR design shown in FIG. 5A and FIG. 5B in an FD-SOI technology is problematic since, on account of the depletion of the body region in FD-SOI, the control via the base region of the npn transistor (i.e. the P-type well region 505) by means of the contact G1 or the control via the base region of the pnp transistor (i.e. the N-type well region 504) by means of the contact G2 will only be very weak. Therefore, the design shown in FIG. 5A and FIG. 5B is not suitable for an implementation of an FD-SOI-SCR.

SCR structures or LVTSCR structures such as those described above cannot be realized in an FD-SOI technology or a MuGFET technology without any problems since the lightly doped body regions are completely separated by the N+-type implantations or P+-type implantations in these technologies. One problem in the realization of a SCR, which is triggered by means of controlling the potential of the lightly doped base regions, in an FD-SOI technology or a MuGFET technology, consists, for example, in the fact that, since the N+/P+-type implantations in an FD-SOI technology or a MuGFET technology extend down as far as the bottom of the silicon layer (or as far as the buried oxide layer) contact cannot be made in a manner with the lightly doped body regions in these technologies.

In other words, by way of example, a SOI-SCR structure cannot be applied to a MuGFET technology since making contact with the body regions in a fin structure is extremely difficult or complicated, which is illustrated with reference to FIGS. 6 and 7.

Figure 6:
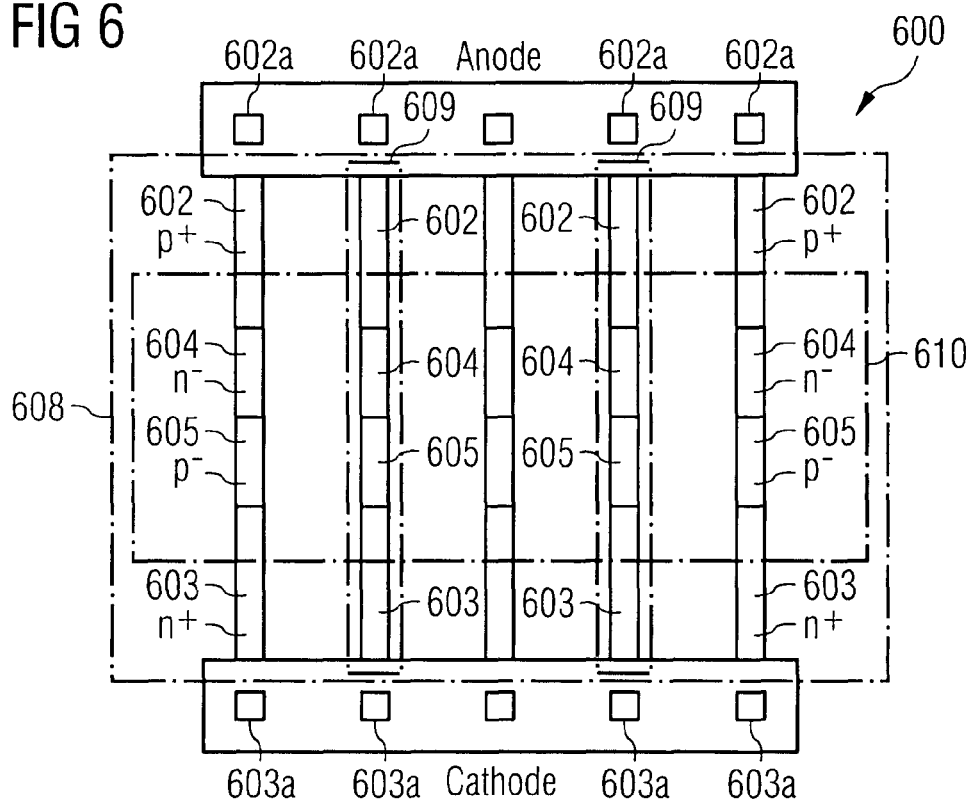
FIG. 6 shows an SCR layout based on a standard MuGFET design.

FIG. 6 shows a schematic layout of a SCR structure 600, as would be realized in accordance with a standard MuGFET technology. In other words, FIG. 6 shows a SCR structure analogously applied to a standard MuGFET technology.

The SCR 600 has a multi-fin structure 608 having a plurality of fin structures (fins) 609 connected in parallel, each fin 609 having a heavily p-doped (P+) first contact region 602 and a heavily n-doped (N+) second contact region 603 and also a weakly n-doped (N−) first body region 604 and a weakly p-doped (P−) second body region 605. Electrical contact is made with the first contact regions 602 of the fin structures 609 jointly by means of a plurality of first electrical contacts 602a, and electrical contact is made with the second contact regions 603 of the fin structures 609 jointly by means of a plurality of second electrical contacts 603a. The first contact regions 602 form together with the first electrical contacts 602a an anode (identified by "Anode" in FIG. 6) of the SCR 600, while the second contact regions 603 form together with the second electrical contacts 603a a cathode (identified by "Cathode" in FIG. 6) of the SCR 600. In order to prevent a short circuit between the first contact region 602 and the second contact region 603 of a fin structure 609, it is necessary to block a siliciding within the region identified by the dashed line 610.

As can be discerned from FIG. 6, each first body region 604 and each second body region 605 of the SCR 600 is fully insulated in the standard MuGFET design. In other words, the weakly n-doped (N−) first body regions 604 of the individual fin structures 609 are mutually insulated from one another. Likewise, the weakly p-doped (P−) second body regions 605 are mutually insulated from one another. Therefore, it is not possible to make electrical contact with the first body regions 604 and with the second body regions 605 of the SCR 600 in the case of the standard MuGFET design shown in FIG. 6.

Figure 7:
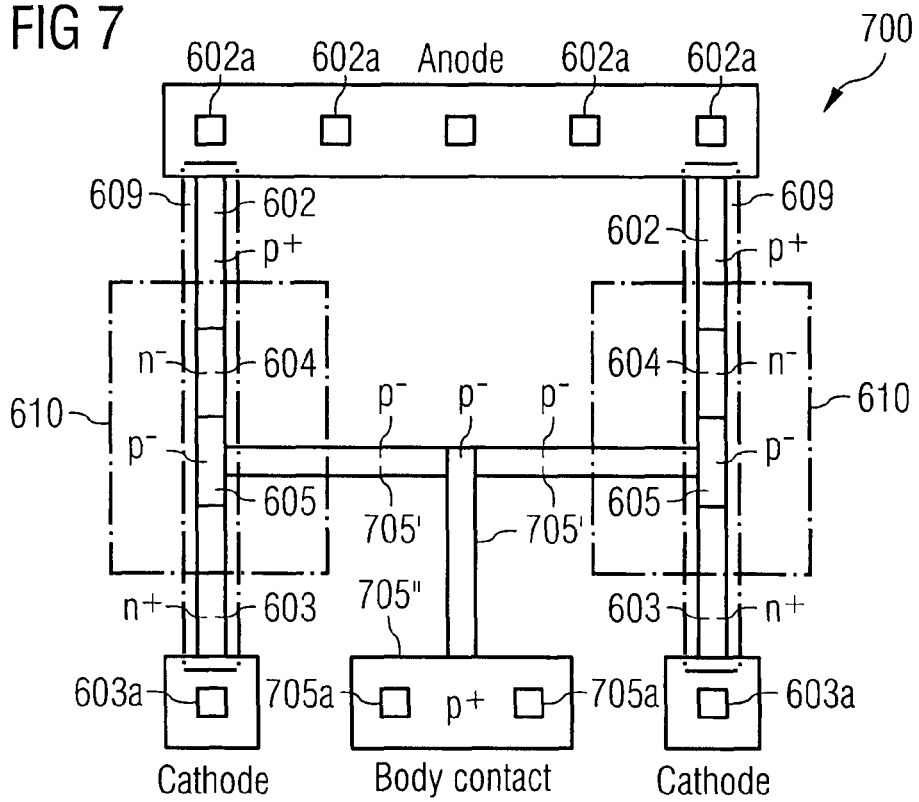
FIG. 7 shows an SCR layout based on a modified MuGFET design.

FIG. 7 shows an SCR 700 having a modified MuGFET design, which enables contact to be made with the weakly p-doped second body regions 605. The SCR 700 has a weakly p-doped (P−) contact structure 705', which is formed between two fin structures 609 and laterally makes contact with the respective weakly p-doped (P−) second body regions 605 of the fin structures 609. The contact structure 705' is furthermore coupled to a third heavily p-doped (P+) contact region 705", with which electrical contact is made by means of third electrical contacts 705a.

With the aid of the contact structure 705', the third contact region 705" and the third electrical contacts 705a, this enables contact to be made with the second body regions 605 of the SCR 700 (identified by "Body contact" in FIG. 7). However, one effect of the modified MuGFET design shown in FIG. 7 obviously consists in the fact that the modified MuGFET design has a considerably greater area requirement compared with the standard MuGFET design shown in FIG. 6. Furthermore, the design shown in FIG. 7 makes effective linking of an external trigger signal inefficient.

To summarize, it can be stated that ESD protection elements based on thyristors or SCRs (silicon controlled rectifiers) are known for bulk technologies and partially depleted SOI technologies (partially depleted silicon on insulator, PD-SOI). However, the known SCR structures cannot be used for an FD-SOI technology or a MuGFET technology since in these technologies, either it is not possible at all to make contact with the body (cf. the discussion in connection with FIG. 6), or only very weak control of the base regions is possible (cf. the discussion in connection with FIG. 5A and FIG. 5B), a requisite device design additionally entailing a greatly increased area requirement of the protection element (cf. the discussion in connection with FIG. 7).

On account of the effects mentioned above, therefore, SCRs are generally not used in an FD-SOI technology or MuGFET technology.

In accordance with one exemplary embodiment of the invention, an ESD protection element for use in an electrical circuit is provided. The ESD protection element has a fin structure having: a first connection region having a first conductivity type, a second connection region having a second conductivity type, which is opposite to the first conductivity type, and also a plurality of body regions which are formed alongside one another and which are formed between the first connection region and the second connection region. The body regions alternately have the first conductivity type and the second conductivity type. The ESD protection element furthermore has at least one gate region formed on or above at least one of the plurality of body regions. In addition, the ESD protection element has at least one gate control device which is electrically coupled to the at least one gate region and which is set up in such a way that at least one electrical potential applied to the at least one gate region can be controlled.

In accordance with another exemplary embodiment of the invention, an ESD protection element for use in an electrical circuit is provided, said element having a fully depleted silicon-on-insulator structure. The fully depleted silicon-on-insulator structure has: a first connection region having a first conductivity type, a second connection region having a second conductivity type, which is opposite to the first conductivity type, and also a plurality of body regions which are formed alongside one another and which are formed between the first connection region and the second connection region. The body regions alternately have the first conductivity type and the second conductivity type. The ESD protection element furthermore has at least one gate region formed on or above at least one of the plurality of body regions. In addition, the ESD protection element has at least one gate control device which is electrically coupled to the at least one gate region and which is set up in such a way that at least one electrical potential applied to the at least one gate region can be controlled, in such a way that the ESD protection element has a high electrical resistance during a first operating state of the electrical circuit, and that the ESD protection element has a lower electrical resistance during a second operating state of the electrical circuit, said second operating state being characterized by the occurrence of an ESD event.

In accordance with another exemplary embodiment of the invention, an ESD protection device for use in an electrical circuit is provided. The ESD protection device has at least one ESD protection element which is connected in parallel with at least one element of the electrical circuit that is to be protected against an ESD event.

In accordance with another exemplary embodiment of the invention, an ESD protection element based on an SCR structure is provided which can be realized in a MuGFET technology or an FD-SOI technology.

In accordance with another exemplary embodiment of the invention, a device design and a trigger mechanism for an ESD protection element based on an SCR (silicon controlled rectifier) are provided, which device design and which trigger mechanism can be realized in a MuGFET technology (multi-gate field effect transistor) or in an FD-SOI technology (fully depleted silicon on insulator).

In accordance with another exemplary embodiment of the invention, an SCR-ESD protection element is provided which can be realized by means of a standard FD-SOI process flow or a standard MuGFET process flow, in which silicide blocking is available, without e.g. an additional mask being required. A further effect of the device design proposed consists in the fact that the SCR structure of the ESD protection element does not have a greatly increased area requirement, in contrast e.g. to the structure shown in FIG. 7.

In accordance with another exemplary embodiment of the invention, a trigger control of an ESD protection element is effected with the aid of one or a plurality of gate regions (control gates), which gate regions are formed on or above one or a plurality of body regions of the ESD protection element. Consequently, it is not necessary to make electrical contact with the body regions (also called floating body regions, that is to say body regions having a "floating" electrical potential). The at least one gate of the ESD protection element is coupled to at least one gate control device, with the aid of which at least one electrical potential applied to the at least one gate can be controlled, whereby in turn the surface potential of the body region or body regions, on or above which body region(s) the at least one gate is formed, can be controlled.

In accordance with another exemplary embodiment of the invention, in an ESD protection element having a fin structure, the at least one gate control device may be set up in such a way that, with the aid of the at least one gate control device, the at least one electrical potential applied to the at least one gate region can be controlled in such a way that the ESD protection element has a high electrical resistance during a first operating state of the electrical circuit, and that the ESD protection element has a lower electrical resistance during a second operating state of the electrical circuit, said second operating state being characterized by the occurrence of an ESD event.

By means of the driving of the at least one gate region, it is possible to achieve a triggering of the SCR structure of the ESD protection element, in which case the at least one gate region and the at least one gate control device electrically coupled to the at least one gate region may be set up in such a way that a uniform triggering of the ESD protection element can be achieved, and hence for example a low clamping voltage and/or a high ESD robustness of the ESD protection element. As a result, the ESD protection element can be used for protecting very sensitive circuit components such as e.g. thin gate oxides.

In accordance with another exemplary embodiment of the invention, the first connection region (also called first contact region hereinafter) and/or the second connection region (also called second contact region hereinafter) and/or at least one of the plurality of body regions have silicon material. In other words, the first connection region and/or the second connection region and/or at least one of the plurality of body regions may be formed from a silicon layer, which silicon layer may be formed for example on a buried oxide layer (buried oxide, BOX), e.g. a silicon dioxide layer. In accordance with another exemplary embodiment of the invention, the first connection region has a p conductivity type, and the second connection region has an n conductivity type. In other words, in accordance with this exemplary embodiment, the first connection region (or first contact region) of the ESD protection element is formed as a p-conducting region, and the second connection region (or second contact region) of the ESD protection element is formed as an n-conducting region.

A first connection region formed as a p-conducting region may be heavily p-doped (e.g. $p^+$-doped), for example with a doping intensity or dopant concentration of approximately greater than $10^{20}$ cm$^{-3}$.

A second connection region formed as a n-conducting region may be heavily n-doped (e.g. $n^+$-doped), for example with a doping intensity or dopant concentration of approximately greater than $10^{20}$ cm$^{-3}$.

At least one of the plurality of body regions may be formed as a weakly doped region or lightly doped region (for example as an n⁻-doped or p⁻-doped region), for example with a doping intensity or dopant concentration of approximately $10^{17}$ cm⁻³ to $10^{18}$ cm⁻³.

In accordance with another exemplary embodiment of the invention, a body region is formed directly alongside the first connection region, which body region has the second conductivity type. In other words, in accordance with this exemplary embodiment, a body region having the second conductivity type directly adjoins the first connection region (having the first conductivity type). To put it in yet another way, the first connection region has a common interface with a body region, which body region has the (second) conductivity type opposite to the (first) conductivity type of the first connection region. As an alternative, one or a plurality of intermediate regions may be formed between the first connection region and the body region having the second conductivity type. The intermediate region or intermediate regions may be doped, for example in such a way that a lateral dopant gradient is formed. By way of example, a plurality of intermediate regions having different degrees of doping may be formed alongside one another between a heavily p-doped (e.g. p⁺-doped) first connection region and a weakly n-doped (e.g. n⁻-doped) body region, in such a way that a gradual transition from the heavy p-type doping of the first connection region to the weak n-type doping of the body region is achieved, in which case that intermediate region which is directly adjacent to the heavily p-doped first connection region may have approximately the same or a slightly lower p-type doping than the first connection region, and that intermediate region which is directly adjacent to the weakly n-doped body region may have approximately the same or a slightly higher n-type doping than the weakly n-doped body region.

In accordance with another exemplary embodiment of the invention, a body region is formed directly alongside the second connection region, which body region has the first conductivity type. In other words, in accordance with this exemplary embodiment, a body region having the first conductivity type directly adjoins the second connection region (having the second conductivity type). To put it in yet another way, the second connection region has a common interface with a body region, which body region has the (first) conductivity type opposite to the (second) conductivity type of the second connection region. As an alternative, one or a plurality of intermediate regions may be formed between the second connection region and the body region having the first conductivity type. The intermediate region or intermediate regions may be doped, for example in such a way that a lateral dopant gradient is formed. By way of example, a plurality of intermediate regions having different degrees of doping may be formed alongside one another between a heavily n-doped (e.g. n⁺-doped) second connection region and a weakly p-doped (e.g. p⁻-doped) body region, in such a way that a gradual transition from the heavy n-type doping of the second connection region to the weak p-type doping of the body region is achieved, in which case that intermediate region which is directly adjacent to the heavily n-doped second connection region may have approximately the same or a slightly lower n-type doping than the second connection region, and that intermediate region which is directly adjacent to the weakly p-doped body region may have approximately the same or a slightly higher p-type doping than the weakly p-doped body region.

In accordance with another exemplary embodiment of the invention, a first body region and a second body region are formed between the first connection region and the second connection region, the first body region having the second conductivity type (that is to say the conductivity type of the second connection region), and the second body region having the first conductivity type (that is to say the conductivity type of the first connection region). The first body region may be formed directly alongside the first connection region, and the second body region may be formed directly alongside the second connection region. In other words, on the one hand, the first connection region and the first body region may have a common interface, and, on the other hand, the second connection region and the second body region may have a common interface. Furthermore, the first body region and the second body region may have a common interface. As an alternative, a diffusion region may be formed between the first body region and the second body region, which diffusion region may have the first conductivity type or the second conductivity type.

The first body region may, if the first connection region is formed as a p-conducting (e.g. p⁺-doped) region, be formed as an n-conducting region, e.g. as a weakly n-doped (e.g. n⁻-doped) region, for example with a doping intensity or dopant concentration of approximately $10^{17}$ cm⁻³ to $10^{18}$ cm⁻³.

The second body region may, if the second connection region is formed as an n-conducting (e.g. n⁺-doped) region, be formed as a p-conducting region, e.g. as a weakly p-doped (e.g. p⁻-doped) region, for example with a doping intensity or dopant concentration of approximately $10^{17}$ cm⁻³ to $10^{18}$ cm⁻³.

A diffusion region formed between the first body region and the second body region may be formed as a heavily doped region, for example with a dopant concentration of approximately greater than $10^{20}$ cm⁻³. The diffusion region may be formed as a heavily n-doped (e.g. n⁺-doped) region. As an alternative, the diffusion region may be formed as a heavily p-doped (e.g. p⁺-doped) region.

An ESD protection element having a p-conducting first connection region, an n-conducting first body region, a p-conducting second body region and an n-conducting second connection region clearly has a pnpn four-layer structure or SCR structure with three pn junctions.

At least one of the plurality of body regions may have a well implantation (well implant) or a threshold voltage implantation (Vt implant). As an alternative, the body regions may be formed as intrinsic regions, in which circumstance, in the case of an intrinsic body, an ESD protection element may be regarded as a pin diode.

In accordance with another exemplary embodiment of the invention, the at least one gate region may have an electrically insulating layer (e.g. an oxide layer), to put it another way a gate dielectric, and also an electrically conductive gate layer formed on the electrically insulating layer. The gate dielectric may have silicon dioxide, and the electrically conductive gate layer may have polysilicon, a metal or some other suitable electrically conductive material.

In accordance with another exemplary embodiment of the invention, a gate region is formed on or above the first body region and/or the second body region, which gate region is electrically coupled to a gate control device. In other words, a gate region may be formed on or above one of the two body regions, or a gate region may be formed on or above both body regions. With the aid of a single gate region formed on or above the first body region and the second body region, it is possible to control the surface potential of the first body region and of the second body region simultaneously.

In accordance with another exemplary embodiment of the invention, a first gate region is formed on or above the first body region, which first gate region is electrically coupled to a first gate control device, and a second gate region is formed on or above the second body region, which second body region is electrically coupled to a second gate control device. In this exemplary embodiment, the ESD protection element clearly has a so-called "split gate".

In accordance with another exemplary embodiment of the invention, 2m (m∈N, m≧2) body regions are formed between the first connection region and the second connection region of the ESD protection element. In other words, an even number of body regions greater than or equal to four (i.e. 4, 6, 8, 10, etc.) may be formed between the first connection region and the second connection region of the ESD protection element, the body regions alternately having the first conductivity type and the second conductivity type. It may hold true for all k (k∈N, 1≦k≦m) that the (2k−1)-th body region has the second conductivity type, and that the 2k-th body region has the first conductivity type. If, by way of example, the first connection region is formed as a p-conducting region, and the second connection region as an n-conducting region, then the ESD protection element may have a pnpn . . . pn layer structure having a total of 2m+2 regions (first connection region+2m body regions+second connection region) of alternate conductivity types (p-conducting and n-conducting) that are formed alongside one another.

In accordance with another exemplary embodiment of the invention, an ESD protection element having 2m (m∈N, m≧2) body regions may have m−1 first diffusion regions, which have the second conductivity type, and also m−1 second diffusion regions, which have the first conductivity type, the first diffusion regions and the second diffusion regions being arranged in such a way that it holds true for all k (k∈N, 1≦k≦m−1) that a first diffusion region and a second diffusion region are formed alongside one another between the 2k-th body region and the (2k+1)-th body region, in such a way that the first diffusion region is formed between the 2k-th body region and the second diffusion region, and that the second diffusion region is formed between the first diffusion region and the (2k+1)-th body region (that is to say has a common interface with the (2k+1)-th body region). The first diffusion region may be formed directly alongside the 2k-th body region (that is to say have a common interface with the 2k-th body region), and/or the second diffusion region may be formed directly alongside the (2k+1)-th body region (that is to say have a common interface with the (2k+1)-th body region). In this exemplary embodiment, the ESD protection element clearly has a stacked SCR structure having m stacked SCR structures.

In accordance with another exemplary embodiment of the invention, a respective gate region is formed on or above all body regions of the ESD protection element that have the same conductivity type. By way of example, in the case of an SCR structure having a total of 2m body regions, of which m body regions have the first conductivity type and the remaining m body regions have the second conductivity type, a respective gate region may be formed on or above each body region that has the first conductivity type. As an alternative, a respective gate region may be formed on or above each body region that has the second conductivity type.

In accordance with another exemplary embodiment of the invention, a respective gate region is formed on or above each of the 2m body regions.

In accordance with another exemplary embodiment of the invention, the ESD protection element has a gate control device, all gate regions formed on or above a body region having the first conductivity type being electrically coupled to the gate control device. As an alternative, all gate regions formed on or above a body region having the second conductivity type may be electrically coupled to the gate control device.

In accordance with another exemplary embodiment of the invention, the ESD protection element has a first gate control device and a second gate control device, those gate regions which are formed on or above a body region having the first conductivity type being electrically coupled to the first gate control device, and those gate regions which are formed on or above a body region having the second conductivity type being electrically coupled to the second gate control device. In this exemplary embodiment, the ESD protection element clearly has a "split gate stack".

In accordance with another exemplary embodiment of the invention, the first connection region is electrically coupled to a high electrical potential, for example to an electrical supply voltage or to an I/O voltage. The first connection region of the ESD protection element may be electrically coupled for example to a voltage-carrying node of a circuit to be protected.

The second connection region may be electrically coupled to a low electrical potential or a reference potential, for example to an electrical ground potential.

In accordance with another exemplary embodiment of the invention, the at least one gate control device is formed as an ESD detection circuit. The ESD detection circuit may be set up in such a way that, with the aid of the ESD detection circuit, for example fast voltage transients (which may occur e.g. in the form of a rising edge of an ESD pulse) or the overshooting of critical overvoltage threshold values can be detected, and the occurrence of an ESD event can thus clearly be "identified" or detected. The ESD detection circuit may therefore alternatively also be referred to as an ESD detector circuit (or for short: ESD detector).

The gate control device may be set up in such a way that when an ESD event occurs, the electrical potential present at the at least one gate region of the ESD protection element is changed (that is to say decreased or increased) in such a way that the ESD protection element is triggered and assumes a low-impedance state. The gate control device may therefore clearly also be referred to as a trigger device. The EDS protection element may be triggered with the aid of an ESD detector circuit, which ESD detector circuit may therefore also be referred to as a trigger circuit. Suitable known trigger circuits may be used as the trigger circuit.

The trigger circuit may have a series circuit, for example, which series circuit has a zener diode and an electrical resistance element connected in series with the zener diode, in which case a first electrical connection of the zener diode may be coupled for example to an electrical supply voltage or to a voltage-carrying node in a circuit to be protected and a second electrical connection of the zener diode is electrically coupled to a first electrical connection of the electrical resistance element and to at least one gate region of an ESD protection element, said gate region being formed above at least one p-conducting body region, and in which case a second electrical connection of the electrical resistance element is coupled to a low electrical potential (e.g. electrical ground potential).

In accordance with another exemplary embodiment of the invention, the trigger circuit has a series circuit, which series circuit has a capacitance (e.g. a capacitor) and an electrical resistance element connected in series with the capacitance, in which case a first electrical connection of the capacitance may be coupled for example to an electrical supply voltage or to a voltage-carrying node in a circuit to be protected and a second electrical connection of the capacitance is electrically coupled to a first electrical connection of the electrical resistance element and to at least one gate region of an ESD protection element, said gate region being formed above at least one p-conducting body region, and in which case a second electrical connection of the electrical resistance element is coupled to a low electrical potential (e.g. electrical ground potential).

In accordance with another exemplary embodiment of the invention, the trigger circuit has a series circuit, which series circuit has a diode sequence having a plurality of series-connected diodes and also an electrical resistance element connected in series with the diode sequence, in which case a first electrical connection of the diode sequence may be coupled for example to an electrical supply voltage or to a voltage-carrying node in a circuit to be protected and a second electrical connection of the diode sequence is electrically coupled to a first electrical connection of the electrical resistance element and to at least one gate region of an ESD protection element, said gate region being formed above at least one p-conducting body region, and in which case a second electrical connection of the electrical resistance element is coupled to a low electrical potential (e.g. ground potential).

In accordance with another exemplary embodiment of the invention, the trigger circuit has a series circuit, which series circuit has a field effect transistor and an electrical resistance element connected in series with the field effect transistor, in which case a first source/drain connection of the field effect transistor may be electrically coupled for example to an electrical supply voltage or to a voltage-carrying node in a circuit to be protected and a second source/drain connection of the field effect transistor is electrically coupled to a first electrical connection of the electrical resistance element and to at least one gate region of an ESD protection element, said gate region being formed above at least one p-conducting body region. A second electrical connection of the electrical resistance element is coupled to a low electrical potential (e.g. ground potential). The field effect transistor may be formed as an NMOS field effect transistor, in which case a gate connection of the NMOS field effect transistor may be coupled to a low electrical potential (e.g. ground potential). As an alternative, the field effect transistor may be formed as a PMOS field effect transistor, in which case a gate connection of the PMOS field effect transistor may be electrically coupled to a high electrical potential (e.g. to an electrical supply voltage or to a voltage-carrying node in a circuit to be protected). As an alternative, the gate connection of the NMOS or PMOS field effect transistor may be coupled to a circuit, in which case an electrical potential present at the gate connection of the field effect transistor can be controlled with the aid of the circuit.

In accordance with another exemplary embodiment of the invention, the trigger circuit has a series circuit, which series circuit has an electrical resistance element and a zener diode connected in series with the electrical resistance element, in which case a first electrical connection of the electrical resistance element may be coupled for example to an electrical supply voltage or to a voltage-carrying node in a circuit to be protected and a second electrical connection of the electrical resistance element is electrically coupled to a first electrical connection of the zener diode and to at least one gate region of an ESD protection element, said gate region being formed above at least one n-conducting body region, and in which case a second electrical connection of the zener diode is coupled to a low electrical potential (e.g. ground potential).

In accordance with another exemplary embodiment of the invention, the trigger circuit has a series circuit, which series circuit has an electrical resistance element and a capacitance (e.g. a capacitor) connected in series with the electrical resistance element, in which case a first electrical connection of the electrical resistance element may be coupled for example to an electrical supply voltage or to a voltage-carrying node in a circuit to be protected and a second electrical connection of the electrical resistance element is electrically coupled to a first connection of the capacitance and to at least one gate region of an ESD protection element, said gate region being formed above at least one n-conducting body region, and in which case a second electrical connection of the capacitance is coupled to a low electrical potential (e.g. ground potential).

In accordance with another exemplary embodiment of the invention, the trigger circuit has a series circuit, which series circuit has an electrical resistance element and a diode sequence having a plurality of series-connected diodes, said diode sequence being connected in series with the electrical resistance element, in which case a first electrical connection of the electrical resistance element may be coupled for example to an electrical supply voltage or to a voltage-carrying node in a circuit to be protected and a second electrical connection of the electrical resistance element is electrically coupled to a first electrical connection of the diode sequence and to at least one gate region of an ESD protection element, said gate region being formed above at least one n-conducting body region, and in which case a second electrical connection of the diode sequence is coupled to a low electrical potential (e.g. ground potential).

In accordance with another exemplary embodiment of the invention, the trigger circuit has a series circuit, which series circuit has an electrical resistance element and a field effect transistor connected in series with the electrical resistance element, in which case a first electrical connection of the electrical resistance element may be coupled for example to an electrical supply voltage or to a voltage-carrying node in a circuit to be protected and a second electrical connection of the electrical resistance element is electrically coupled to a first source/drain connection of the field effect transistor and to at least one gate region of an ESD protection element, said gate region being formed above at least one n-conducting body region. A second source/drain connection of the field effect transistor is electrically coupled to a low electrical potential (e.g. ground potential). The field effect transistor may be formed as an NMOS field effect transistor, in which case a gate connection of the NMOS field effect transistor may be coupled to a low electrical potential (e.g. ground potential). As an alternative, the field effect transistor may be formed as a PMOS field effect transistor, in which case a gate connection of the PMOS field effect transistor may be electrically coupled to a high electrical potential (e.g. to an electrical supply voltage or to a voltage-carrying node in a circuit to be protected). As an alternative, the gate connection of the NMOS or PMOS field effect transistor may be coupled to a circuit, in which case an electrical potential present at the gate connection of the field effect transistor can be controlled with the aid of the circuit.

In accordance with another exemplary embodiment of the invention, the ESD protection device has a plurality of ESD protection elements connected in parallel, the ESD protection elements connected in parallel having at least one common gate region.

By way of example, an ESD protection device may have a multi-fin structure having a plurality of ESD protection elements connected in parallel, each ESD protection element having a fin structure. In this case, one or a plurality of gate regions may be formed on or above all the fin structures (fins) formed in the multi-fin structure. Clearly, with the aid of a common gate region (that is to say a gate region formed on or above all the fins of the multi-fin structure), it is possible to achieve a uniform triggering, to put it another way a uniform turn-on, of the ESD protection elements formed in the multi-fin structure.

In accordance with one exemplary embodiment of the invention, an ESD protection element for a MuGFET technology or an FD-SOI technology is provided, which ESD protection element has a gate-controlled SCR structure having a low trigger voltage and is electrically coupled to at least one gate control device (e.g. an ESD detector circuit or trigger circuit). The SCR may have two highly doped electrode regions and at least two lightly doped floating body regions, and also at least one gate region for controlling the surface potential of one or a plurality of body regions. The SCR structure can be triggered by virtue of the fact that a MOS channel in one or a plurality of the body regions is "turned on" by a suitable change in the at least one electrical potential present at the at least one gate region. The gate control, that is to say the control of the electrical potential applied to a gate region, is effected with the aid of the at least one gate control device, which may be set up in such a way that fast transients occurring during an ESD event and/or the overshooting of critical overvoltage threshold values can be detected.

In accordance with another exemplary embodiment of the invention, an ESD protection element for use in an electrical circuit is provided, which ESD protection element has a fully depleted silicon-on-insulator structure. The fully depleted silicon-on-insulator structure has: a first connection region having a first conductivity type, a second connection region having a second conductivity type, which is opposite to the first conductivity type, and also a plurality of body regions which are formed alongside one another and which are formed between the first connection region and the second connection region, the body regions alternately having the first conductivity type and the second conductivity type, a body region being formed directly alongside the first connection region, which body region has the second conductivity type, a body region being formed directly alongside the second connection region, which body region has the first conductivity type, and each body region of the plurality of body regions having a dopant concentration that is lower than a dopant concentration of the first connection region and lower than a dopant concentration of the second connection region. The ESD protection element furthermore has: at least one gate region formed on or above at least one of the plurality of body regions; at least one gate control device which is electrically coupled to the at least one gate region and which is set up in such a way that an electrical potential applied to the at least one gate region can be controlled, in such a way that the ESD protection element has a high electrical resistance during a first operating state of the electrical circuit, and that the ESD protection element has a lower electrical resistance during a second operating state of the electrical circuit, said second operating state being characterized by the occurrence of an ESD event.

Figure 8A:
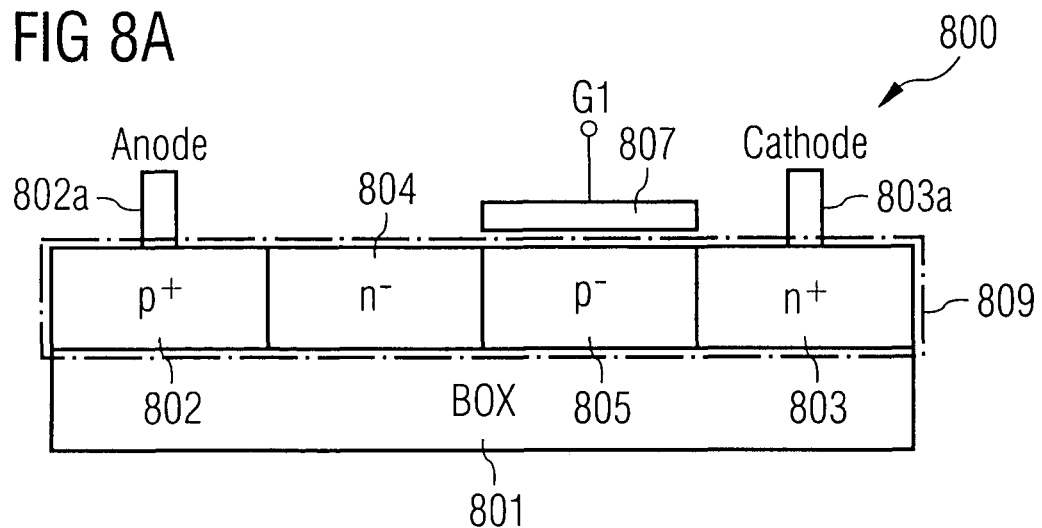
FIG. 8A shows a cross-sectional view of an ESD protection element in accordance with one exemplary embodiment of the invention.

FIG. 8A shows a cross-sectional view of an ESD protection element 800 based on a MuGFET technology in accordance with one exemplary embodiment of the invention, which ESD protection element 800 can be used in an electrical circuit for protection against electrostatic discharges or ESD events.

The ESD protection element 800 has a fin structure (fin) 809 formed on a buried oxide layer (BOX: buried oxide) 801, which fin structure has a heavily p-doped (P+) first connection region 802 and a heavily n-doped (N+) second connection region 803. A weakly n-doped (N−) first body region 804 and a weakly p-doped (P−) second body region 805 are formed between the first connection region 802 and the second connection region 803, the weakly n-doped (N−) first body region 804 being formed between the heavily p-doped (P+) first connection region 802 and the weakly p-doped (P−) second body region 805, and the weakly p-doped (P−) second body region 805 furthermore being formed between the weakly n-doped (N−) first body region 804 and the heavily n-doped (N+) second connection region 803, thus clearly resulting in a four-layer diode configuration or an SCR structure comprising four regions formed alongside one another (first connection region 802 (P+), first body region 804 (N−), second body region 805 (P−) and second connection region 803 (N+)) having alternate conductivity types (p-conducting and n-conducting) and a total of three pn junctions.

Electrical contact is made with the heavily p-doped (P+) first connection region 802 by means of a first electrical contact 802a and said first connection region clearly forms an anode region or an anode of the SCR structure (designated by "Anode" in FIG. 8A), while electrical contact is made with the heavily n-doped (N+) second connection region 803 by means of a second electrical contact 803a and said second connection region clearly forms a cathode region or a cathode of the SCR structure (designated by "Cathode" in FIG. 8A). Therefore, the highly doped connection regions 802 and 803 are also referred to as contact regions or as electrode regions.

A gate region or gate is formed above the weakly p-doped (P−) second body region 805, which gate is represented by a gate electrode 807 in FIG. 8A. The gate 807 may have an electrically insulating layer, e.g. an oxide layer (gate oxide), which is formed on the upper surface (top face) and also on the two side faces of the second body region 805, and also an electrically conductive gate layer (for example made of polysilicon or metal) formed on the electrically insulating layer.

That part of the electrically insulating layer (also called gate insulating layer hereinafter) which is formed on the top face of the second body region 805 may have the same thickness as those parts of the gate insulating layer which are formed on the side faces of the second body region 805. In other words, the gate insulating layer formed on the second body region 805 may have the same thickness (e.g. approximately 1 nm to 10 nm) everywhere. What can be achieved as a result is that the second body region 805 can be driven from three sides (i.e. the top face and the two side faces of the second body region 805) with the aid of the conductive gate layer formed on the gate insulating layer. The ESD protection element shown in FIG. 8A may therefore clearly have a triple-gate structure or multi-gate structure.

As an alternative, the electrically insulating layer (gate insulating layer) formed on the second body region 805 may be formed with a larger thickness on the upper top face of the second body region 805 than on the two side faces of the second body region 805. If the gate insulating layer has a larger thickness on the upper top face of the second body region 805 than on the side faces of the second body region 805, then what is achieved is that the second body region 805 is driven only from two sides (i.e. the two side faces of the second body region 805) with the aid of the conductive gate layer (so-called double-gate structure).

The gate 807 is electrically coupled by means of a gate connection G1 to a gate control device (not shown, cf. FIG. 14A to FIG. 14D), with the aid of which an electrical potential applied to the gate region 807 can be controlled, in such a way that the ESD protection element 800 has a high electrical resistance during a first operating state of the electrical circuit (that is to say a normal operating state, in which a supply voltage is applied to the electrical circuit), and that the ESD protection element has a lower electrical resistance during a second operating state of the electrical circuit, said second operating state being characterized by the occurrence of an ESD event (ESD pulse).

In the case of the ESD protection element 800 shown in FIG. 8A, the weakly n-doped first body region 804 is formed directly alongside the heavily p-doped first connection region 802, with the result that the SCR structure of the ESD protection element 800 has a pn junction between the highly doped (P+) first connection region 802 and the lightly doped (N−) first body region 804. In accordance with an alternative exemplary embodiment (not shown) of the invention, one or a plurality of intermediate regions may be formed between the first connection region 802 and the first body region 804, which intermediate regions may be doped to different extents, in such a way that a gradual transition from the heavy p-type doping of the first connection region 802 to the weak n-type doping of the first body region 804 is realized. Clearly, a lateral dopant gradient may be realized by means of one or a plurality of intermediate regions formed between the first connection region 802 and the first body region 804. In an analogous manner, one or a plurality of intermediate regions may be formed between the heavily n-doped (N+) second connection region 803 and the weakly p-doped (P−) second body region 805, with the aid of which intermediate region or intermediate regions a gradual transition from the heavy n-type doping of the second connection region 803 to the weak p-type doping of the second body region 805 can be achieved.

The functioning of the ESD protection element 800 is explained in more detail below, it being assumed that the ESD protection element 800 is connected in parallel with one or more elements of the electrical circuit to be protected against an ESD event. It is furthermore assumed that an electrical potential VG1 applied to the gate region 807 initially has a low value (VG1="low").

If a high electrical potential is applied to the anode (first connection region 802) of the ESD protection element 800, e.g. by the coupling of the first connection region 802 to a VDD potential (supply voltage of the circuit) or to an input/output connection (I/O pad) of the circuit, and if, furthermore, a low electrical potential is applied to the cathode (second connection region 803, e.g. by coupling of the second connection region 803 to a VSS potential of the circuit or to the ground potential), then the PN junction between the weakly n-doped (N−) first body region 804 and the weakly p-doped (P−) second body region 805 effects blocking.

The surface potential of the weakly p-doped (P−) second body region 805 can be controlled with the aid of the gate region 807 or the electrical potential VG1 applied to the gate 807. The second body region 805 clearly forms the channel region of an NMOS transistor, which NMOS transistor is formed from the first body region 804 (N−), the second body region 805 (P−), the second connection region 803 (N+) and the gate region 807 of the ESD protection element 800. Since the electrical potential VG1 applied to the gate region 807 initially has a low value (VG1="low"), the NMOS transistor is switched off ("off").

Consequently, the ESD protection element 800 has a high electrical resistance in a first (normal) operating state of the electrical circuit. To put it another way, the ESD protection element 800 is at high impedance or switched off ("off state") during the first operating state of the electrical circuit, and only a very low reverse current flows through the SCR structure of the ESD protection element 800.

If the electrical potential VG1 applied to the gate 807 is then increased (VG1→"high"), an electrically conductive MOS channel forms in the second body region 805, and the ESD protection element 800 or the SCR structure of the ESD protection element 800 becomes conducting or acquires low impendence. In other words, the ESD protection element 800 is triggered by the application of a high electrical potential to the gate 807 and has a lower electrical resistance. After the SCR structure has been triggered, the low-impedance state of the SCR is maintained, independently of the electrical potential present at the gate 807, on account of a positive feedback effect due to the SCR structure (regenerative behaviour of the SCR), until the current from the anode to the cathode falls below a specific value, i.e. the so-called holding current (at which, for example, an associated holding voltage may be of the order of magnitude of 1 V). In this so-called holding state, therefore, the potential present at the gate region 807 is only of secondary importance. Clearly the SCR remains turned on (in the "on state") for as long as the value of the current from the anode to the cathode lies above the holding current value. If the current between anode and cathode falls below the holding current, then the SCR switches off, i.e. acquires high impedance again.

The ESD protection element 800 is set up in such a way that it can be triggered, upon the occurrence of an ESD event, with the aid of the gate control device electrically coupled to the gate region 807 and consequently assumes the low-impedance state. The gate control device may be formed as an ESD detector circuit (cf. FIG. 14A to FIG. 14D), with the aid of which, for example, fast voltage transients or the overshooting of critical overvoltage threshold values can be detected.

In other words, in the case of an ESD event, the potential present at the gate region 807 can be increased by means of the gate control device to such a great extent that the SCR structure of the ESD protection element 800 acquires low impedance and the ESD protection element 800, in this second operating state of the electrical circuit, can dissipate a high ESD current e.g. to earth, such that an element of the electrical circuit that is connected in parallel with the ESD protection element 800 is not damaged or destroyed by the ESD event. As soon as the ESD event is over and the current between anode and cathode of the ESD protection element 800 has fallen below the value of the holding current, the ESD protection element 800 automatically switches off, that is to say it acquires high impedance again.

With the aid of the gate 807 formed above the second body region 804, and the gate control device electrically coupled to the gate 807, the trigger voltage of the SCR structure of the ESD protection element 800 can clearly be reduced to such an extent (e.g. significantly below the value of a breakdown voltage of a sensitive gate oxide of a field effect transistor to be protected) that the ESD protection element 800, in the case of an ESD event, can reliably protect an element of the electrical circuit that is connected in parallel with the ESD protection element 800. Clearly, the ESD protection element shown in FIG. 8A can therefore be referred to as an ESD protection element which is based on an SCR with a low trigger voltage and which can be realized in a MuGFET technology (alternatively in an FD-SOI technology) e.g. using standard process steps of the corresponding technology. One effect of the ESD protection element 800 is that, in contrast to LVTSCR structures, by way of example, no $N^+$-type diffusion is required in the central region (that is to say between anode and cathode). Furthermore, long distances (for example between anode and cathode) are avoided in the case of the ESD protection element 800.

Figure 8B:
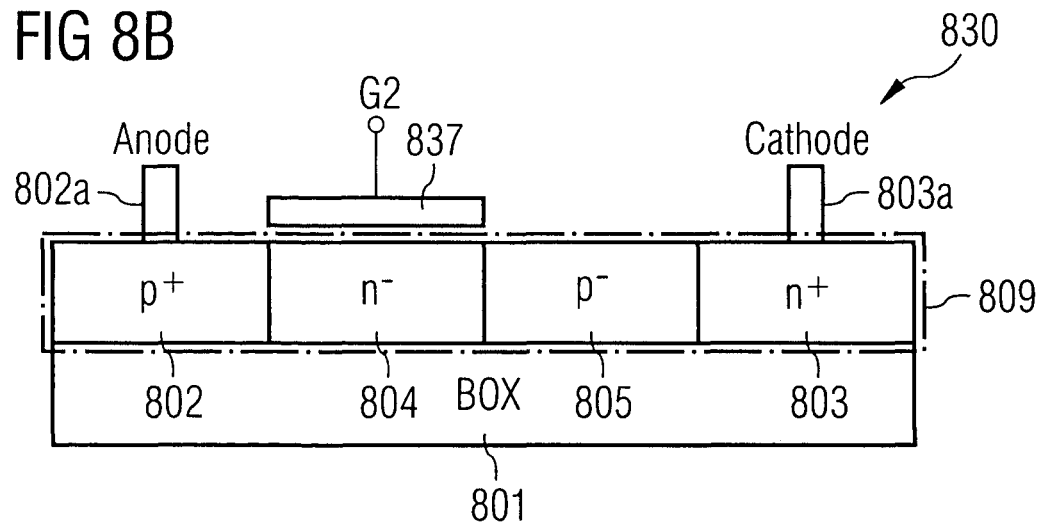
FIG. 8B shows a cross-sectional view of an ESD protection element in accordance with another exemplary embodiment of the invention.

FIG. 8B shows a cross-sectional view of an ESD protection element 830 in accordance with another exemplary embodiment of the invention. The ESD protection element 830 differs from the ESD protection element 800 shown in FIG. 8A by virtue of the fact that, instead of the gate 807 formed above the weakly p-doped second body region 805, a gate region or a gate (represented by a gate electrode 837 in FIG. 8B) is formed above the weakly n-doped first body region 804. In a manner similar to that described above in connection with the gate 807, the gate 837 may have an electrically insulating layer (e.g. a gate oxide layer or a gate oxide), which may be formed on the upper surface (top face) and the two side faces of the first body region 804, and also an electrically conductive gate layer formed on the gate oxide. The gate 837 may be formed in such a way that the ESD protection element 830 has a triple-gate structure or multi-gate structure (that is to say driving of the first body region 804 from three sides) or a double-gate structure (driving of the first body region 804 from the two side faces). The gate 837 is electrically coupled by means of a gate connection G2 to a gate control device, e.g. an ESD detector circuit (not shown, cf. FIG. 15A to FIG. 15D).

The functioning of the ESD protection element 830 is similar to that of the ESD protection element 800 shown in FIG. 8A; in contrast to the ESD protection element 800, the ESD protection element 830 is triggered by an electrically conductive channel being formed with the aid of the gate control device in the first body region 805, which clearly forms a channel region of a PMOS transistor formed from the heavily p-doped (P+) first connection region 802, the weakly n-doped (N−) first body region 804, the weakly p-doped (P−) second body region 805 and the gate 837. For this purpose, a high electrical potential VG2 present at the gate region 837 can be correspondingly reduced by means of the gate control device, such that the PMOS transistor, which turns off when a high electrical potential is present, undergoes transition to a low-impedance state.

In accordance with an alternative exemplary embodiment (not shown) of the invention, a first gate region 807 may be formed above the weakly p-doped (P−) second body region 805, which first gate region 807 is electrically coupled by means of a first gate connection G1 to a first gate control device, and at the same time a second gate region 837 may be formed above the weakly n-doped (N−) first body region 804, which second gate region 837 is electrically coupled by means of a second gate connection G2 to a second gate control device. In accordance with this exemplary embodiment, the first gate region 807 and the second gate region 837 may be formed in such a way that, on the one hand, they cover the respective body regions in order to obtain a good punch-through of the gate potential, and that, on the other hand, they do not mutually touch one another. Clearly, the ESD protection element in accordance with this exemplary embodiment has a so-called "Split gate".

The structures of the ESD protection elements 800 and 830 are clearly combined in this embodiment. As a result, in the case of an ESD event, the MOS channel of the NMOS transistor (with the aid of the first gate control device coupled to the first gate connection G1) and/or the MOS channel of the PMOS transistor (with the aid of the second gate control device coupled to the second gate connection G2) of the SCR structure can be "turned on" by means of the application of suitable electrical potentials to the first gate region 807 and/or to the second gate region 837 and the ESD protection element can therefore be triggered.

Figure 8C:
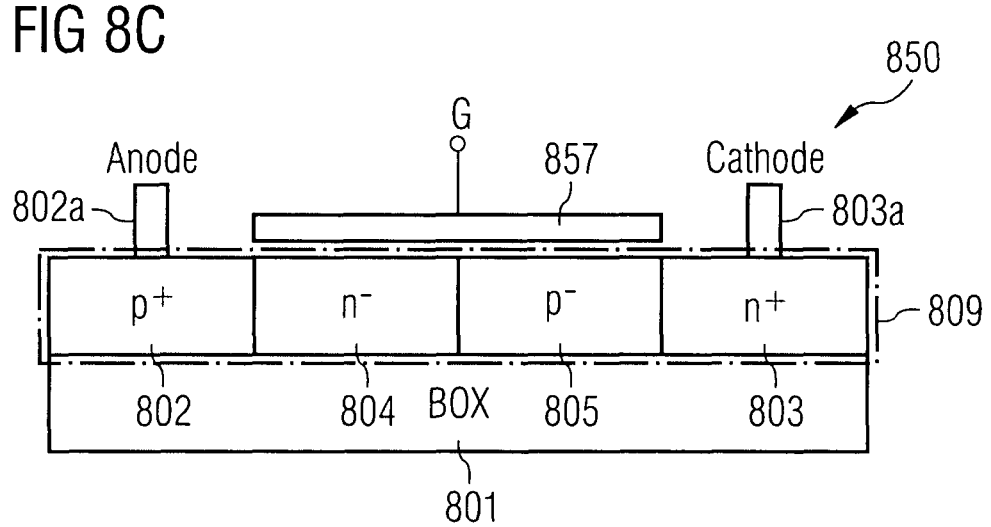
FIG. 8C shows a cross-sectional view of an ESD protection element in accordance with another exemplary embodiment of the invention.

FIG. 8C shows a cross-sectional view of an ESD protection element 850 in accordance with another exemplary embodiment of the invention, in which, in contrast to the asymmetrical structures 800 and 830, in which only the surface potential of the second body region 805 is controlled by means of the control gate 807 and, respectively, only the surface potential of the first body region 804 is controlled by means of the control gate 837, a gate region 857 is formed above both body regions 804 and 805, with the result that the surface potential of the weakly n-doped (N−) first body region 804 and of the weakly p-doped (P−) second body region 805 can be controlled simultaneously with the aid of the common gate 857. In a manner similar to that described above for the gate 807 and the gate 837, the gate 857 may have an electrically insulating layer (e.g. a gate oxide layer) formed on the upper surface and the two side faces of the first body region 804 and of the second body region 805, and also an electrically conductive gate layer formed on the gate oxide. In a manner similar to that in the case of the ESD protection elements 800 and 830 described in connection with FIG. 8A and FIG. 8B respectively, the gate 857 of the ESD protection element 850 may be formed in such a way that the ESD protection element has a triple-gate structure (multi-gate structure) or alternatively a double-gate structure. The gate 857 is electrically coupled by means of a gate connection G to a gate control device that controls the electrical potential applied to the gate 857.

The symmetrical structure of the ESD protection element 850 that is shown in FIG. 8C may be used if the voltage applied to the anode (first connection region 802) is less than approximately 2×0.7 V=1.4 V.

Figure 8D:
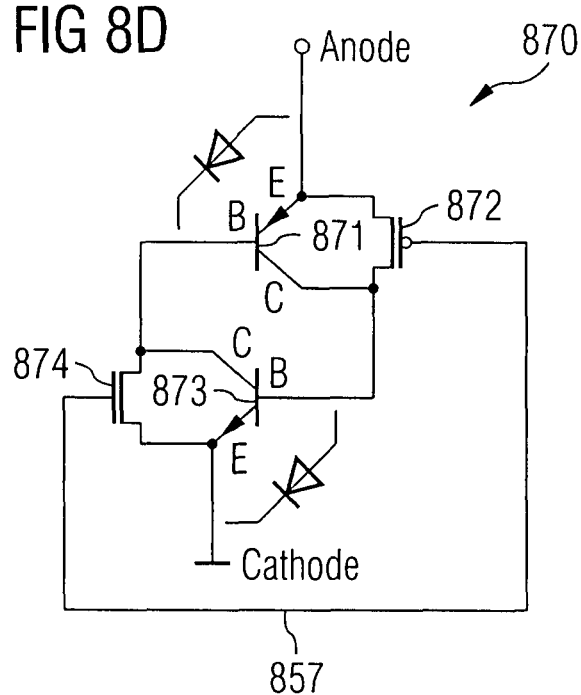
FIG. 8D shows an electrical equivalent circuit diagram of the ESD protection element shown in FIG. 8C.

FIG. 8D shows an electrical equivalent circuit diagram 870 of the ESD protection element 850 shown in FIG. 8C, which circuit diagram 870 reveals the pnp bipolar transistor structure 871 formed from the first connection region 802, the first body region 804 and the second body region 805 of the ESD protection element 850, which pnp structure 871 with inclusion of the gate 857 produces a PMOS transistor 872. Furthermore, the circuit diagram 870 reveals the npn bipolar transistor structure 873 formed from the first body region 804, the second body region 805 and the second connection region 803 of the ESD protection element 850, which npn structure 873 with inclusion of the gate 857 produces an NMOS transistor 874. It can furthermore be seen from the circuit diagram 870 that the base (R) of the pnp transistor 871 simultaneously forms the collector (C) of the npn transistor 873, and that conversely the base (B) of the npn transistor 873 simultaneously forms the collector (C) of the pnp transistor 871. In accordance with one exemplary embodiment of the invention, the use of an SOI technology makes it possible to form floating body regions, that is to say weakly n-doped or weakly p-doped body regions having a floating electrical potential, with the result that an intrinsic current-voltage characteristic (I-V characteristic) is determined solely by built-in BE-junctions (base-emitter junctions) of the pnp transistor 871 and of the npn transistor 873, and also by the threshold voltage of the PMOS transistor 872 and of the NMOS transistor 874.

Figure 8E:
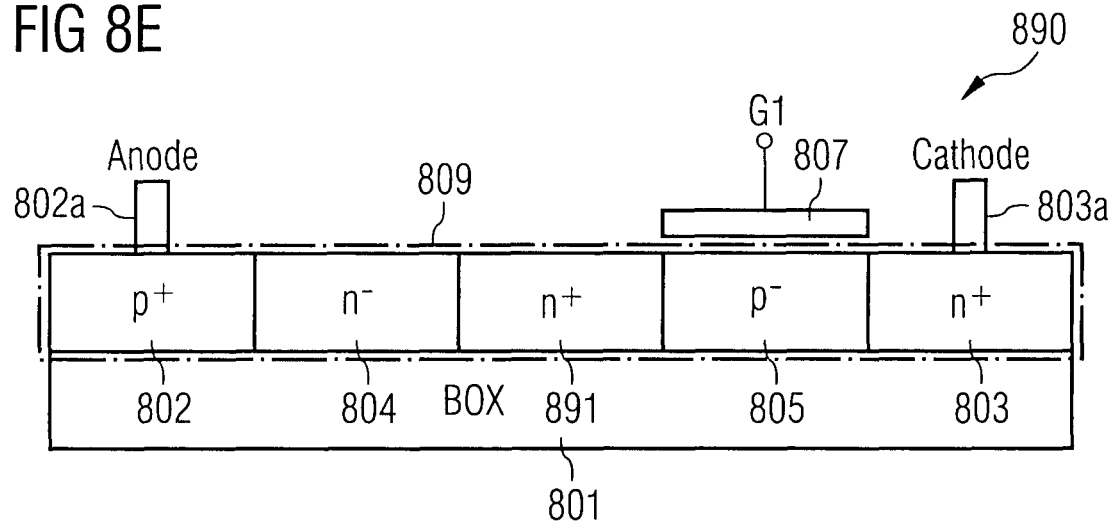
FIG. 8E shows a cross-sectional view of an ESD protection element in accordance with another exemplary embodiment of the invention.

FIG. 8E shows a cross-sectional view of an ESD protection element 890 in accordance with another exemplary embodiment of the invention. The ESD protection element 890 differs from the ESD protection element 800 shown in FIG. 8A by virtue of the fact that a heavily n-doped (N+) diffusion region 891 is formed between the first body region 804 and the second body region 805. The diffusion region 891 may have a dopant concentration similar to that of the first connection region 802 and/or the second connection region 803.

Figure 8F:
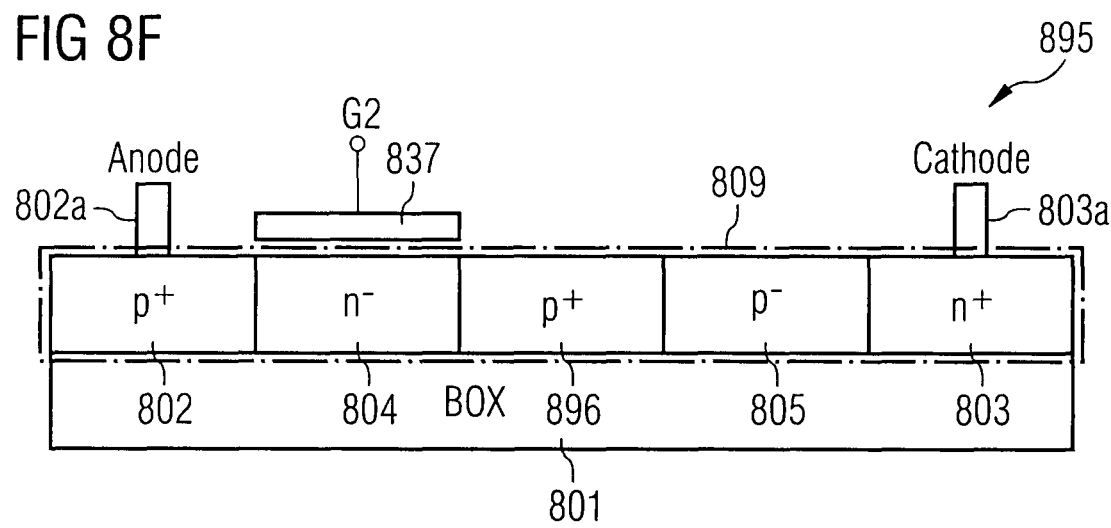
FIG. 8F shows a cross-sectional view of an ESD protection element in accordance with another exemplary embodiment of the invention.

FIG. 8F shows a cross-sectional view of an ESD protection element 895 in accordance with another exemplary embodiment of the invention. The ESD protection element 895 differs from the ESD protection element 830 shown in FIG. 8B by virtue of the fact that a heavily p-doped (P+) diffusion region 896 is formed between the first body region 804 and the second body region 805. The diffusion region 896 may have a dopant concentration similar to that of the first connection region 802 and/or the second connection region 803.

Figure 9:
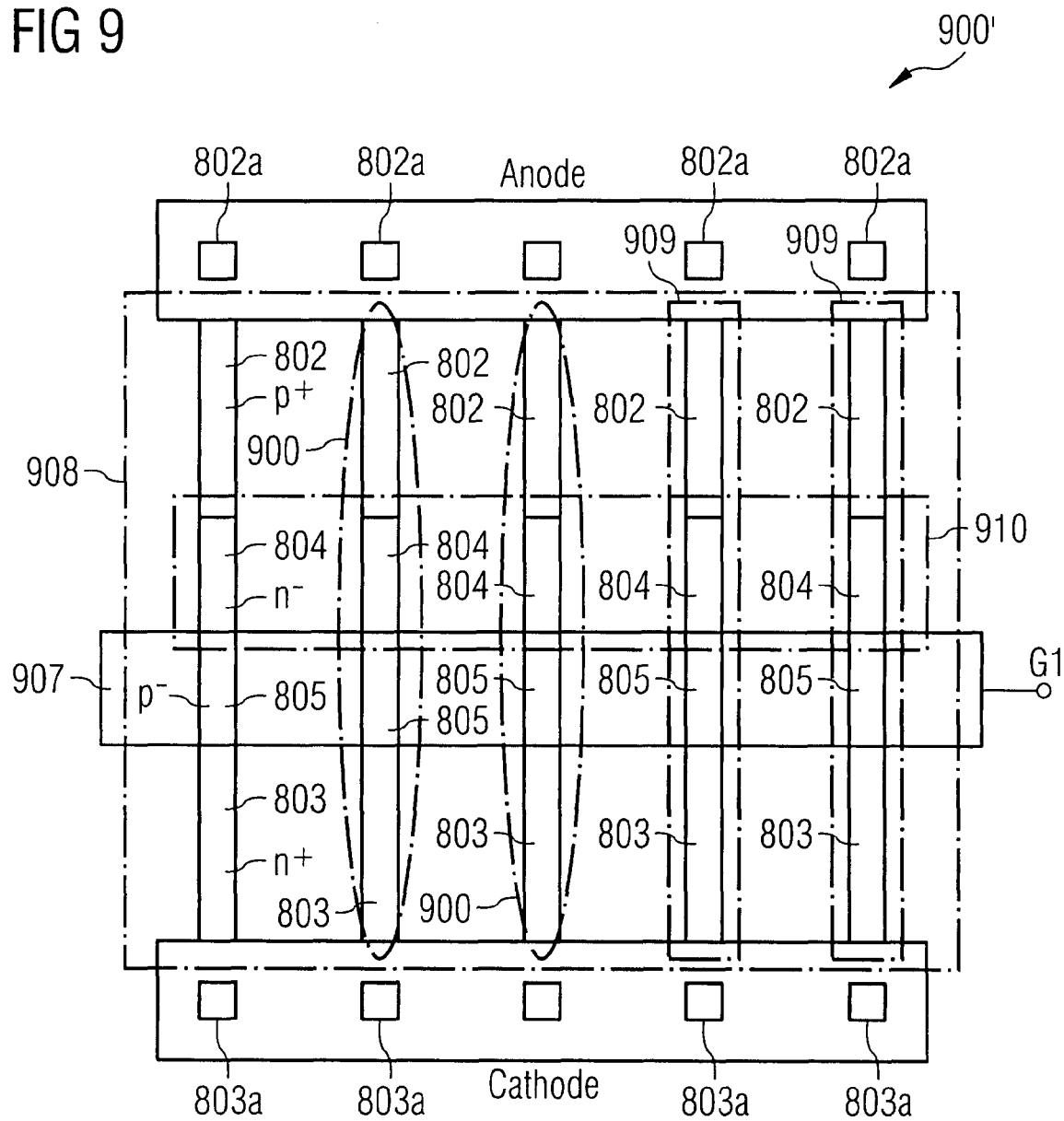
FIG. 9 shows a layout illustration of an ESD protection device in accordance with another exemplary embodiment of the invention.

FIG. 9 shows a layout illustration of an ESD protection device 900' based on a MuGFET technology in accordance with one exemplary embodiment of the invention. The ESD protection device 900' has a multi-fin structure 908 having a plurality of ESD protection elements 900 connected in parallel, each ESD protection element 900 having a fin structure 909. Each fin structure (fin) 909 has a heavily p-doped (P+) first connection region 802 and a heavily n-doped (N+) second connection region 803, and also a weakly n-doped (N−) first body region 804 and a weakly p-doped (P−) second body region 805. The weakly n-doped (N−) first body region 804 and the weakly p-doped (P−) second body region 805 are formed between the heavily p-doped (P+) first connection region 802 and the heavily n-doped (N+) second connection region 803 in such a way that the weakly n-doped (N−) first body region 804 is formed between the heavily p-doped (P+) first connection region 802 and the weakly p-doped (P−) second body region 805, and that the weakly p-doped (P−) second body region 805 is furthermore formed between the weakly n-doped (N−) first body region 804 and the heavily n-doped (N+) second connection region 803. The fin structures 900 therefore have a similar SCR structure to those shown in FIG. 8A to FIG. 8C.

Electrical contact is made with the first connection regions 802 (also referred to as first contact regions 802) of the fin structures 909 jointly by means of a plurality of first electrical contacts 802a, and electrical contact is made with the second connection regions 803 (also referred to as second contact regions 903) jointly by means of a plurality of second electrical contacts 803a. The first connection regions 802 form together with the first electrical contacts 802a an anode region or an anode (designated by "Anode" in FIG. 9) of the ESD protection device 900', while the second connection regions 803 form together with the second electrical contacts 803a a cathode region or a cathode (designated by "Cathode" in FIG. 9) of the ESD protection device 900'.

The multi-fin structure 908 of the ESD protection device 900' has a gate region or a gate (represented by the gate electrode 907), which gate 907 is formed above the weakly p-doped (P−) second body regions 805 of the parallel-connected ESD protection elements 900 (or the respective fin structures 909). In other words, the ESD protection elements 900 formed in the ESD protection device 900' have a common gate 907, which is clearly wound over the topology of the fin structures 909 of the multi-fin structure 908. In this case, the gate 907 may be set up in the manner that has been described for example in connection with the ESD protection element 800 shown in FIG. 8A. The gate 907 is electrically coupled by means of a gate connection G1 to a gate control device, which may be formed as an ESD detector circuit (cf. FIG. 14A to FIG. 14D). With the aid of the gate control device, an electrical potential VG1 applied to the gate region 907 can be controlled, whereby in turn the surface potential of the weakly p-doped (P−) second body regions 805 (clearly the channel regions of the NMOS transistors formed from the regions 804, 805 and 803 of the respective SCR structure and the gate 907) of all the ESD protection elements 900 formed in the ESD protection device 900' can be controlled jointly (cf. description regarding FIG. 8A).

FIG. 9 furthermore illustrates a region 910, in which region siliciding, that is to say the formation of a silicide layer, can be blocked. As a result of the blocking of silicide formation within the region 910, it is possible to prevent an electrical short circuit between the first connection region 802 and the second connection region 803 of a fin structure 909.

The ESD protection device 900' can be used for the protection of one or more elements of an electrical circuit connected in parallel with the ESD protection device 900', the functioning of the ESD protection device 900' being analogous to the functioning of the ESD protection element 800 (see the above description in connection with FIG. 8A).

In accordance with another exemplary embodiment (not shown) of the invention, instead of the common gate 907 formed above the weakly p-doped (P−) second body regions 805 of the ESD protection device 900', a common gate may be formed above the weakly n-doped (N−) first body regions 804 of the ESD protection device 900', which gate can be electrically coupled to a gate control device, e.g. an ESD detector circuit (cf. FIG. 15A to FIG. 15D), by means of a gate connection G2 (cf. FIG. 8B). In this case, the electrical potential applied to the gate region formed above the weakly n-doped (N−) first body regions 804 can be controlled with the aid of the gate control device, whereby in turn the surface potential of the weakly n-doped (N−) first body regions 804 (clearly the channel regions of the PMOS transistors formed from the regions 802, 804 and 805 of the respective SCR structure and the gate) of all the ESD protection elements 900 formed in the ESD protection device 900' can be controlled jointly (cf. description regarding FIG. 8B).

In accordance with yet another exemplary embodiment (not shown) of the invention, analogously to the exemplary embodiment shown in FIG. 8C, a common gate may be formed above the weakly n-doped (N−) first body regions 804, and the weakly p-doped (P−) second body regions 805, which gate can be electrically coupled to a gate control device. In this case, the electrical potential applied to the gate region can be controlled with the aid of the gate control device, whereby the surface potential of the weakly n-doped (N−) first body regions 804 and simultaneously also the surface potential of the weakly p-doped (P−) second body regions 805 of all the ESD protection elements 900 formed in the ESD protection device 900' can be controlled jointly (cf. description regarding FIG. 8C).

FIG. 10A shows a cross-sectional view of an ESD protection element 1000 in accordance with another exemplary embodiment of the invention. The ESD protection element 1000 differs from the ESD protection element 800 shown in FIG. 8A by virtue of the fact that a heavily n-doped (N+) first diffusion region 1002 and a heavily p-doped (P+) second diffusion region 1003 and also a weakly n-doped (N−) third body region 1004 and a weakly p-doped (P−) fourth body region 1005 are formed between the weakly p-doped (P−) second body region 805 and the heavily n-doped (N+) second connection region 803, the first diffusion region 1002, the second diffusion region 1003, the third body region 1004 and the fourth body region 1005 being arranged in such a way that the ESD protection element 1000 alternately has p-conducting regions and n-conducting regions.

Clearly, the ESD protection element 1000 shown in FIG. 10A has two SCR structures connected in series: a first SCR structure SCR-1 has a first pnpn structure, which first pnpn structure is formed from the heavily p-doped (P+) first connection region 802, the weakly n-doped (N−) first body region 804, the weakly p-doped (P−) second body region 805 and the heavily n-doped (N+) first diffusion region 1002, and a second SCR structure SCR-2 has a second pnpn structure, which second pnpn structure is formed from the heavily p-doped (P+) second diffusion region 1003, the weakly n-doped (N−) third body region 1004, the weakly p-doped (P−) fourth body region 1005 and the heavily n-doped (N+) second connection region 803. The first highly doped (N+) diffusion region 1002 clearly serves as an (inner) electrode of the first SCR structure SCR-1, and the second highly doped (P+) diffusion region 1003 clearly serves as an (inner) electrode of the second SCR structure SCR-2.

A first gate region (represented by a first gate electrode 1007a in FIG. 10A) is formed above the weakly p-doped (P−) second body region 805 of the ESD protection element 1000, which first gate region 1007a is electrically coupled to a gate control device (not shown) by means of a first gate connection G1-1. Furthermore, a second gate region (represented by a second gate electrode 1007b in FIG. 10A) is formed above the weakly p-doped (P−) fourth body region 1005 of the ESD protection element 1000, which second gate region 1007b is electrically coupled to the gate control device by means of a second gate connection G1-2. The first gate region 1007a (first gate 1007a) and the second gate region 1007b (second gate 1007b) may be formed in a similar manner to the gate 807 of the ESD protection element 800 described in connection with FIG. 8A.

The ESD protection element 1000 shown in FIG. 10A clearly has a stacked SCR structure having a first SCR structure SCR-1 and a second SCR structure SCR-2, in other words a two-stage SCR stack formed from a first, SCR structure SCR-1 and a second SCR structure SCR-2. The functioning of the ESD protection element 1000 is similar to that of the ESD protection element 800 described in connection with FIG. 8A, it being possible to obtain a higher holding voltage with the aid of the stacked SCR arrangement of the ESD protection element 1000, which can be utilized for example for voltage terminals of VDD lines at 2.5 V. In accordance with other exemplary embodiments of the invention, three or more (generally m) SCR structures SCR-1, SCR-2, . . . , SCR-m can be stacked (m-stage SCR stack, cf. FIG. 11) in an analogous manner in an ESD protection element.

FIG. 10B shows an ESD protection element 1030 in accordance with another exemplary embodiment of the invention. The ESD protection element 1030 differs from the ESD protection element 1000 shown in FIG. 10A by virtue of the fact that, instead of the first gate region 1007a formed above the weakly p-doped (P−) second body region 804 and the second gate region 1007b formed above the weakly p-doped (P−) fourth body region 1004, a third gate region or a third gate (represented by a third gate electrode 1037a in FIG. 10B) is formed above the weakly n-doped (N−) first body region 804 and a fourth gate region or a fourth gate (represented by a fourth gate electrode 1037b in FIG. 10B) is formed above the weakly n-doped (N−) third body region 1005. The third gate 1037a and the fourth gate 1037b may be formed in a similar manner to the first gate 1007a and the second gate 1007b, respectively, of the ESD protection element 1000 described in connection with FIG. 10A. The functioning of the ESD protection element 1030 shown in FIG. 10B is similar to that of the ESD protection element 830 described in connection with FIG. 8B, it being possible to obtain a higher holding voltage with the aid of the stacked SCR arrangement of the ESD protection element 1030, which can be utilized for example for voltage terminals of VDD lines at 2.5 V. In accordance with other exemplary embodiments of the invention, three or more (generally m) SCR structures SCR-1, SCR-2, . . . , SCR-m can be slacked (m-stage SCR stack, cf. FIG. 11) in an analogous manner in an ESD protection element.

FIG. 11 shows a layout of an ESD protection device 1100' based on a MuGFET technology in accordance with another exemplary embodiment of the invention. The ESD protection device 1100' has a multi-fin structure 1108 having a plurality of ESD protection elements 1100 connected in parallel, each ESD protection element 1100 having a fin structure 1109. The fin structure (fin) 1109 of each individual ESD protection element 1100 has a stacked SCR structure having a first SCR structure SCR-1 and a second SCR structure SCR-2 connected in series (alternatively an m-stage SCR stack having m SCR structures SCR-1, SCR-2, . . . , SCR-m), similarly to the structures described in connection with FIG. 10A and FIG. 10B.

With the aid of first gate regions (represented by first gate electrodes 1007a in FIG. 11) formed above the weakly p-doped (P−) second body regions 805 of each fin structure 1109, which first gate regions 1007a are electrically contact-connected by means of a first gate connection G1-1 to a first gate control device (e.g. an ESD detector circuit, cf. FIG. 14A to FIG. 14D), and with the aid of second gate regions (represented by second gate electrodes 1007b in FIG. 11) formed above the weakly p-doped (P−) fourth body regions 1005 of each fin structure 1109, which second gate regions 1007b are electrically contact-connected by means of a second gate connection G1-2 to the first gate control device, it is possible to drive the respective NMOS transistors of the first SCR structures SCR-1 and second SCR structures SCR-2 formed in the fin structures 1109.

The first gate regions 1007a may be formed as a common first gate 1007a, that is to say as a first gate region 1007a formed jointly above all the fin structures 1109, and the second gate regions 1007b may be formed as a common second gate 1007b, that is to say as a second gate region 1007b formed jointly above all the fin structures 1109. In this case, the surface potentials of all the weakly p-doped (P−) second body regions 805 can be controlled with the aid of a common first gate 1007a, and the surface potentials of all the weakly p-doped (P−) fourth body regions 1005 can be controlled with the aid of a common second gate 1007b.

The first gate connection G1-1 can be electrically coupled to the second gate connection G1-2 (represented by the coupling line 1181 and the gate connection G1 in FIG. 11), with the result that the common first gate 1007a or the first gate regions 1007a and the common second gate 1007b or the second gate regions 1007b can be driven jointly by means of the first gate control device.

As an alternative (or in addition), in the case of the ESD protection device 1100 shown in FIG. 11, with the aid of third gate regions (represented by third gate electrodes 1037a in FIG. 11) formed above the weakly n-doped (N−) first body regions 804 of each fin structure 1109, which third gate regions 1037a are electrically contact-connected by means of a third gate connection G2-1 to a second gate control device (e.g. an ESD detector circuit, cf. FIG. 15A to FIG. 15D), and with the aid of fourth gate regions (represented by fourth gate electrodes 1037b in FIG. 11) formed above the weakly n-doped (N−) third body regions 1004 of each fin structure 1109, which fourth gate regions 1037b are electrically contact-connected by means of a fourth gate connection G2-2 to the second gate control device, it is possible to drive the respective PMOS transistors of the first SCR structures SCR-1 and second SCR structures SCR-2 formed in the fin structures 1109. If both the NMOS transistors and the PMOS transistors of the SCR structures SCR-1 and SCR-2 are driven (e.g. with the aid of a first gate control device and a second gate control device), then the ESD protection elements formed in the ESD protection device can clearly be referred to as doubly triggered SCRs.

The third gate regions 1037a may be formed as a common third gate 1037a, that is to say as a third gate region 1037a formed jointly above all the fin structures 1109, and the fourth gate regions 1037b may be formed as a common fourth gate 1037b, that is to say as a fourth gate region 1037b formed jointly above all the fin structures 1109. In this case, the surface potentials of all the weakly n-doped (N−) first body regions 805 can be controlled with the aid of a common third gate 1037a, and the surface potentials of all the weakly n-doped (N−) third body regions 1005 can be controlled with the aid of a common fourth gate 1037b.

The third gate connection G2-1 can be electrically coupled to the fourth gate connection G2-2 (represented by the coupling line 1182 and the gate connection G2 in FIG. 11), with the result that the common third gate 1037a or the third gate regions 1037a and the common fourth gate 1037b or the fourth gate regions 1037b can be driven jointly by means of the second gate control device.

FIG. 12A shows a cross-sectional view of an ESD protection element 1200 in accordance with another exemplary embodiment of the invention. The ESD protection element 1200 differs from the ESD protection element 1000 shown in FIG. 10A by virtue of the fact that the inner electrodes, i.e. the highly doped diffusion regions 1002 and 1003 (cf. FIG. 10A), of the individual SCR structures SCR-1 and SCR-2 are absent in the case of the ESD protection element 1200. The first SCR structure SCR-1 and the second SCR structure SCR-2 clearly overlap in the case of the ESD protection element 1200. A reduction of the area requirement is thereby achieved in comparison with the ESD protection element 1000 shown in FIG. 10A.

FIG. 12B shows a cross-sectional view of an ESD protection element 1230 in accordance with another exemplary embodiment of the invention. Analogously to the ESD protection element 1200 shown in FIG. 12A, the ESD protection element 1230 differs from the ESD protection element 1030 shown in FIG. 10B by virtue of the fact that the inner electrodes, that is to say the highly doped diffusion regions 1002 and 1003 (cf. FIG. 10B), are absent in the case of the ESD protection element 1230, whereby a reduction of the area requirement is achieved in comparison with the ESD protection element 1030 shown in FIG. 10B.

Figure 13:
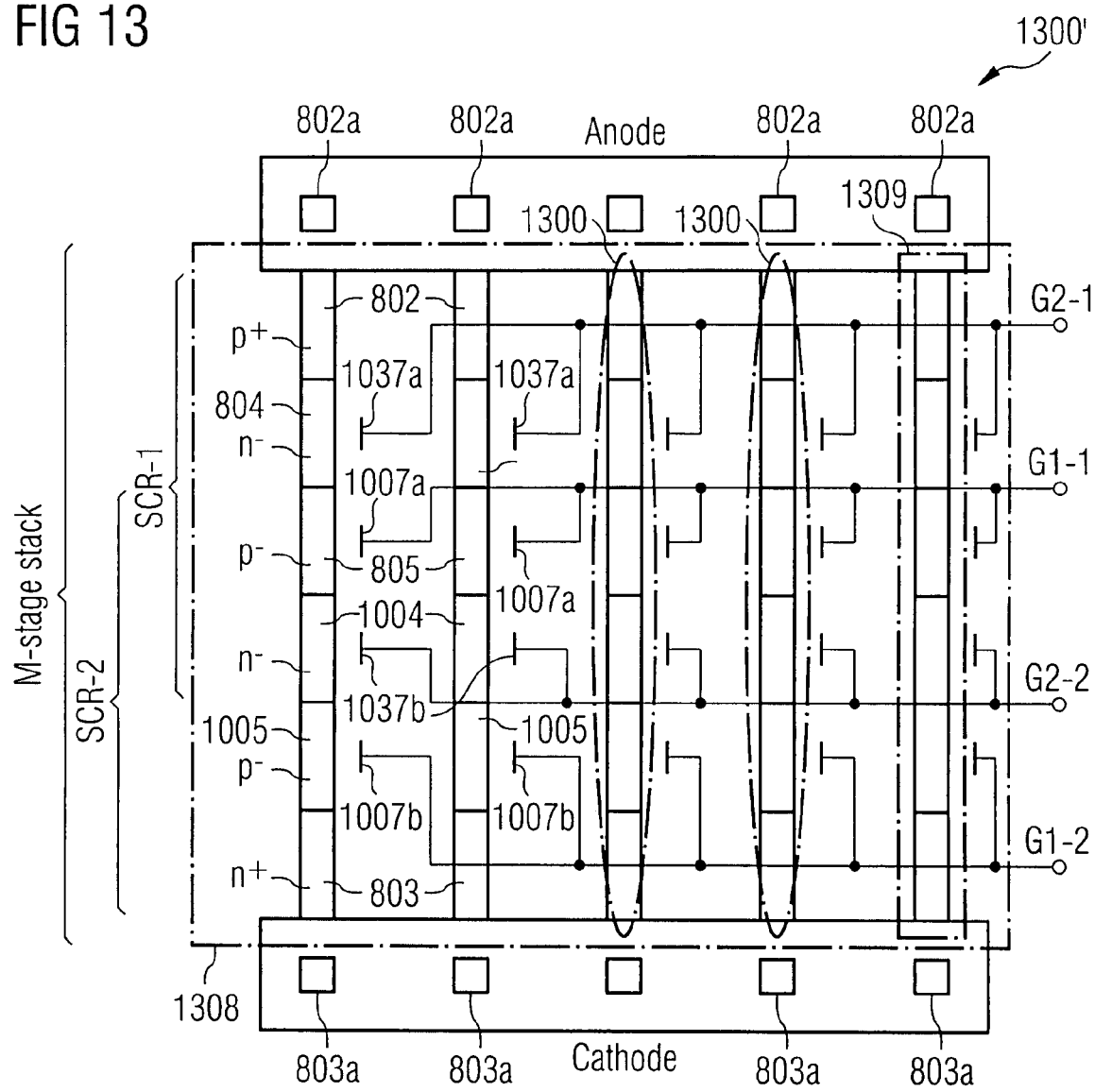
FIG. 13 shows a layout illustration of an ESD protection device in accordance with another exemplary embodiment of the invention.

FIG. 13 shows a layout of an ESD protection device 1300' based on a MuGFET technology in accordance with another exemplary embodiment of the invention. The ESD protection device 1300' has a multi-fin structure 1308 having a plurality of ESD protection elements 1300 connected in parallel, each ESD protection element 1300 having a fin structure 1309. The ESD protection device 1300' differs from the ESD protection device 1100' shown in FIG. 11 by virtue of the fact that, in the case of the ESD protection elements 1300 formed in the ESD protection device 1300', no highly doped diffusion regions 1002 and 1003 or inner electrodes 1002 and 1003 (cf. FIG. 11) are formed in the SCR structures SCR-1 and SCR-2 of the fin structures 1309. The ESD protection elements 1300 formed in the ESD protection device 1300' therefore have a similar structure to the ESD protection elements 1200 and 1230 shown in FIG. 12A and FIG. 12B, respectively. A reduction of the area requirement is thereby achieved.

Figure 14A:
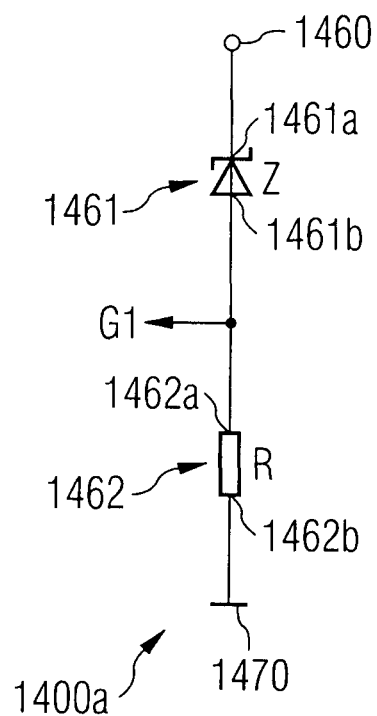
FIG. 14A to FIG. 15D show gate control devices in accordance with different exemplary embodiments of the invention.

FIG. 14A shows a gate control device 1400a—formed as an ESD detector circuit or trigger circuit—of an ESD protection element in accordance with one exemplary embodiment of the invention, which gate control device 1400a can be electrically coupled to at least one gate region formed above at least one p-conducting body region of an ESD protection element, with the result that an electrical potential applied to the at least one gate region can be controlled with the aid of the gate control device, in such a way that the ESD protection element has a high electrical resistance during a first (normal) operating state of the electrical circuit, and that the ESD protection element has a lower electrical resistance during a second operating state of the electrical circuit, said second operating state being characterized by the occurrence of an ESD event.

The gate control device 1400a or the trigger circuit 1400a has a series circuit, which series circuit has a zener diode 1461 and an electrical resistance element 1462 connected in series with the zener diode 1461, a first electrical connection 1461a of the zener diode 1461 being coupled to a high electrical potential (represented by the electrical node 1460), e.g. to the electrical potential (e.g. VDD potential of the electrical circuit) present at the anode of the ESD protection element, and a second electrical connection 1461b of the zener diode 1461 being electrically coupled to a first electrical connection 1462a of the electrical resistance element 1462 and also to at least one gate region of an ESD protection element that is formed above at least one p-conducting body region (represented by the gate connection G1 in FIG. 14A), and a second electrical connection 1462b of the electrical resistance element 1462 being coupled to an electrical ground potential 1470.

The gate connection G1 shown in FIG. 14A may involve for example the gate connection G1 shown in FIG. 8A, the gate connection G1 shown in FIG. 9, one or both of the gate connections (G1-1 and G1-2 shown in FIG. 10A, the gate connection G1 shown in FIG. 11 or one or both of the gate connections G1-1 and G1-2 shown in FIG. 11, one or both of the gate connections G1-1 and G1-2 shown in FIG. 12A or one or both of the gate connections G1-1 and G1-2 shown in FIG. 13.

Figure 14B:
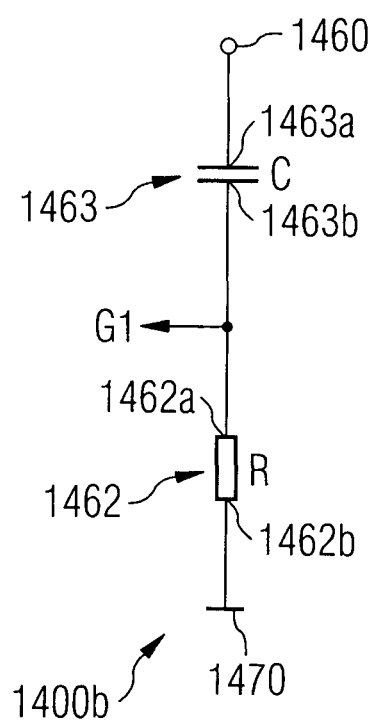

FIG. 14B shows a gate control device 1400b—formed as an ESD detector circuit or trigger circuit—of an ESD protection element in accordance with another exemplary embodiment of the invention. The gate control device 1400b differs from the gate control device 1400a shown in FIG. 14A by virtue of the fact that in the gate control device 1400b, instead of the zener diode 1461, a capacitance 1463 is connected in series with the electrical resistance 1462, in such a way that a first electrical connection 1463a of the capacitance 1463 is electrically coupled to a high electrical potential (e.g. electrical potential of the anode of the ESD protection element), (represented by the node 1460), and a second electrical connection 1463b of the capacitance 1463 is electrically coupled to the first electrical connection 1462a of the electrical resistance element 1462 and also to the at least one gate region (represented by the gate connection G1) of the ESD protection element.

Figure 14C:
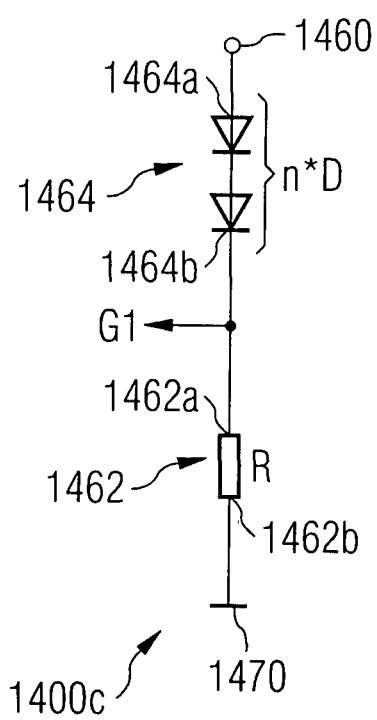

FIG. 14C shows a gate control device 1400c—formed as an ESD detector circuit or trigger circuit—of an ESD protection element in accordance with another exemplary embodiment of the invention. The gate control device 1400c differs from the gate control device 1400a shown in FIG. 14A by virtue of the fact that in the gate control device 1400c, instead of the zener diode 1461, a diode sequence 1464 comprising n-series-connection diodes (n*D) is connected in series with the electrical resistance 1462, in such a way that a first electrical connection 1464a of the diode sequence 1464 is electrically coupled to a high electrical potential (e.g. to the electrical potential of the anode of the ESD protection element), (represented by the electrical node 1460), and a second electrical connection 1464b of the diode sequence 1464 is electrically coupled to the first electrical connection 1462a of the resistance element 1462 and also to the at least one gate region (represented by the gate connection G1) of the ESD protection element.

Figure 14D:
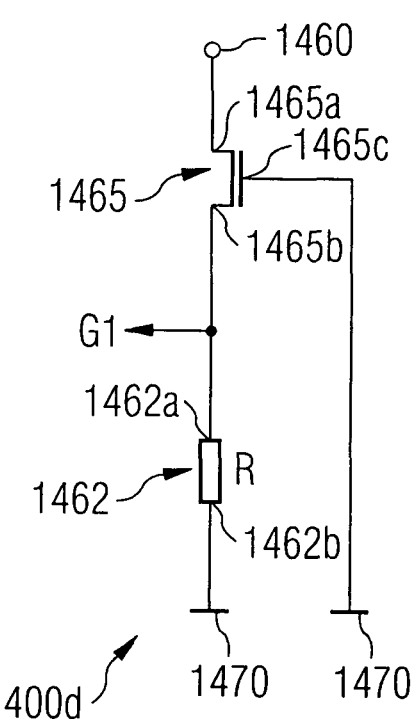

FIG. 14D shows a gate control device 1400d—formed as an ESD detector circuit or trigger circuit—of an ESD protection element in accordance with another exemplary embodiment of the invention. The gate control device 1400d differs from the gate control device 1400a shown in FIG. 14A by virtue of the fact that in the gate control device 1400d, instead of the zener diode 1461, a field effect transistor 1465 (NMOS field effect transistor) is connected in series with the electrical resistance 1462, in such a way that a first source/drain connection 1465a of the field effect transistor 1465 is electrically coupled to the high electrical potential (e.g. VDD potential of the circuit), (represented by the electrical node 1460), that a second source/drain connection 1465b of the field effect transistor 1465 is electrically coupled to the first electrical connection 1462a of the electrical resistance element 1462 and also to the at least one gate region (represented by the gate connection G1) of the ESD protection element, and that a gate connection 1465c of the field effect transistor 1465 is electrically coupled to a low electrical potential (e.g. the electrical ground potential) 1470.

The gate control devices (ESD detector circuits or trigger circuits) 1400a to 1400d are set up in such a way that, using a fast transient occurring during an ESD pulse, the overshooting of an overvoltage threshold can be detected and/or an RC control can be effected.

The functioning of the gate control devices 1400a to 1400d shown in FIG. 14A to FIG. 14D is explained briefly below using the example of the ESD detector circuit 1400a.

The ESD detector circuit 1400a formed in an ESD protection element can be connected in parallel with an element of the electrical circuit that is to be protected. If the ESD protection element is used as a voltage supply terminal, the anode of the ESD protection element can be coupled to a VDD supply potential of the electrical circuit, and the cathode of the ESD protection element can be coupled to a VSS potential of the electrical circuit. As an alternative, if the ESD protection element is used e.g. for the protection of an input/output circuit (I/O circuit), the anode of the ESD protection element can be coupled to the pad and the cathode of the ESD protection element can be coupled to the VSS potential, or the cathode can be coupled to the pad and the anode to the VDD potential.

In a first (normal) operating state of the electrical circuit, with the aid of the ESD detector circuit 1400a, a low electrical potential is provided at the at least one gate region coupled to the second electrical connection 1461b of the zener diode 1461, which at least one gate region is formed above at least one p-conducting body region of the ESD protection element. The corresponding NMOS transistor or NMOS transistors of the ESD protection element therefore turn off, and the ESD protection element is at high impedance. If an ESD event (ESD pulse) is detected by means of the detector circuit 1400a, the potential present at the at least one gate region is clearly "pulled up" (pull-up), and the MOS channel or MOS channels of the NMOS transistors becomes or become conducting, and, on account of the high voltage drop that typically occurs during an ESD event at the ESD protection element, an intense MOS current, in other words an electric current having a high current intensity that flows through the body region or body regions of the ESD protection element, is generated, which triggers the regenerative process (positive feedback effect) of the SCR structure, with the result that the SCR structure undergoes transition to a low-impedance state ("on" state), and the ESD protection element can dissipate the ESD current.

Figure 15A:
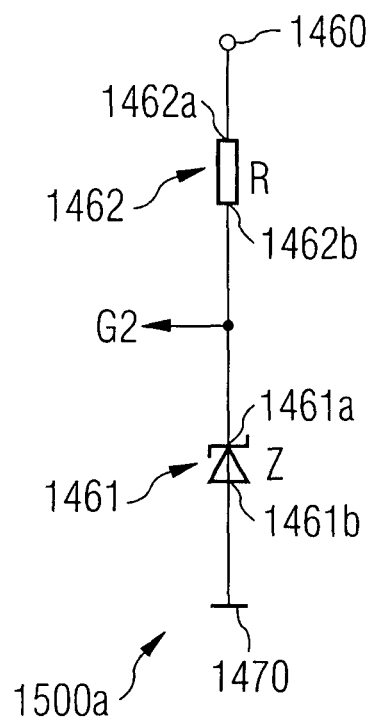

FIG. 15A shows a gate control device 1500a—formed as an ESD detector circuit or trigger circuit—of an ESD protection element in accordance with another exemplary embodiment of the invention, which gate control device 1500a can be electrically coupled to at least one gate region formed above at least one n-conducting body region of an ESD protection element, with the result that an electrical potential applied to the at least one gate region can be controlled with the aid of the gate control device, in such a way that the ESD protection element has a high electrical resistance during a first (normal) operating state of the electrical circuit, and that the ESD protection element has a lower electrical resistance during a second operating state of the electrical circuit, said second operating state being characterized by the occurrence of an ESD event.

The gate control device 1500a or the trigger circuit 1500a has a series circuit, which series circuit has an electrical resistance element 1462 and a zener diode 1462 connected in series with the electrical resistance element 1462, in which case a first electrical connection 1462a of the electrical resistance element 1462 can be coupled to a high electrical potential (e.g. a VDD potential present at the anode of the ESD protection element) (represented by the electrical node 1460), and a second electrical connection 1462b of the electrical resistance element 1462 is electrically coupled to a first electrical connection 1461a of the zener diode 1461 and also to at least one gate region of an ESD protection element that is formed above at least one n-conducting body region (represented by the gate connection G2 in FIG. 15A), and in which case a second electrical connection 1461b of the zener diode 1461 is coupled to an electrical ground potential 1470.

The gate connection G2 shown in FIG. 15A may involve for example the gate connection G2 shown in FIG. 8B, one or both of the gate connections G2-1 and G2-2 shown in FIG. 10B, the gate connection G2 shown in FIG. 11 or one or both of the gate connections G2-1 and G2-2 shown in FIG. 11, one or both of the gate connections G2-1 and G2-2 shown in FIG. 12B or one or both of the gate connections G2-1 and G2-2 shown in FIG. 13.

Figure 15B:
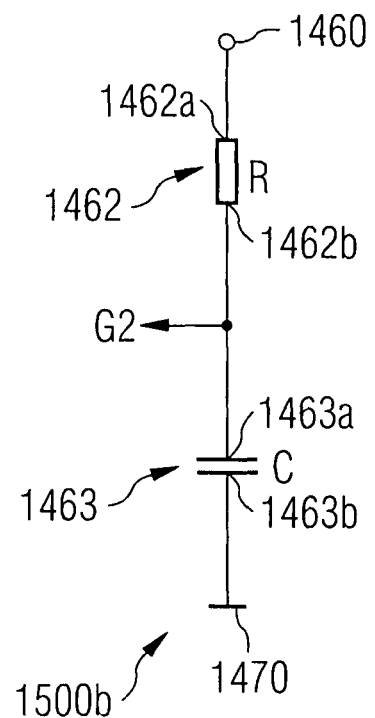

FIG. 15B shows a gate control device 1500b—formed as an ESD detector circuit or trigger circuit—of an ESD protection element in accordance with another exemplary embodiment of the invention. The gate control device 1500b differs from the gate control device 1500a shown in FIG. 15A by virtue of the fact that in the gate control device 1500b, instead of the zener diode 1461, a capacitance 1463 (e.g. a capacitor) is connected in series with the electrical resistance 1462, in such a way that a first electrical connection 1463a of the capacitance 1463 is coupled to the second electrical connection 1462b of the electrical resistance element 1462, and that a second electrical connection 1463b of the capacitance 1463 is coupled to the electrical ground potential 1470.

Figure 15C:
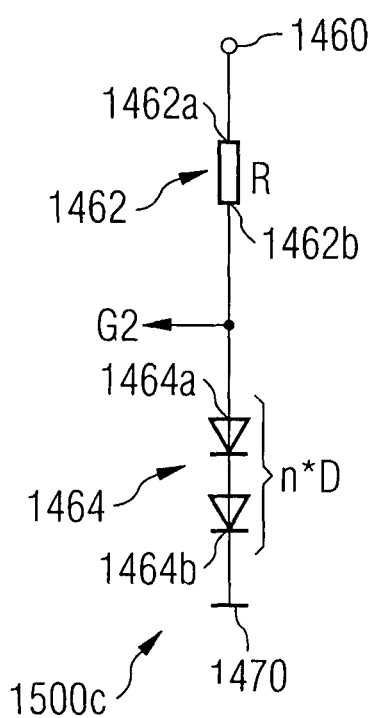

FIG. 15C shows a gate control device 1500c—formed as an ESD detector circuit or trigger circuit—of an ESD protection element in accordance with another exemplary embodiment of the invention. The gate control device 1500c clearly differs from the gate control device 1500a shown in FIG. 15S by virtue of the fact that in the gate control device 1500c, instead of the zener diode 1461, a diode sequence 1464 comprising n-series-connected diodes (n*D) is connected in series with the electrical resistance 1462, in such a way that a first electrical connection 1464a of the diode sequence 1464 is electrically coupled to the second electrical connection 1462b of the electrical resistance element 1462, and that a second electrical connection 1464b of the diode sequence 1464 is coupled to a low electrical potential 1470 (e.g. the electrical ground potential).

Figure 15D:
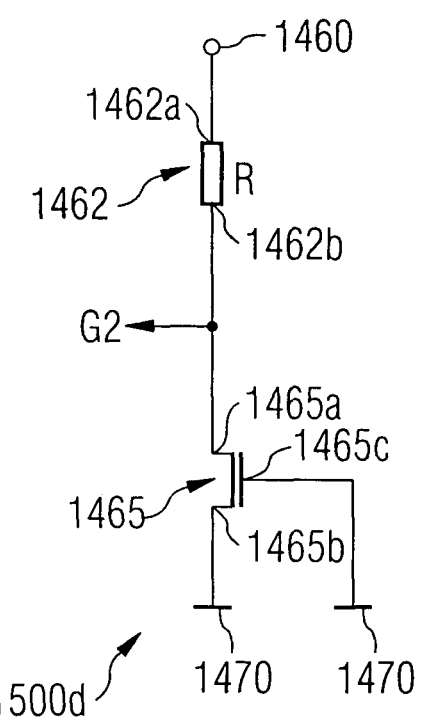

FIG. 15D shows a gate control device 1500d—formed as an ESD detector circuit or trigger circuit—of an ESD protection element in accordance with another exemplary embodiment of the invention. The gate control device 1500d differs from the gate control device 1500a shown in FIG. 15A by virtue of the fact that in the gate control device 1500*d*, instead of the zener diode 1461, a field effect transistor 1465 (NMOS field effect transistor) is connected in series with the electrical resistance 1462, in such a way that a first source/drain connection 1465*a* of the field effect transistor 1465 is electrically coupled to the second electrical connection 1462*b* of the electrical resistance element 1462, that a second source/drain connection 1465*b* of the field effect transistor 1465 is electrically coupled to a low electrical potential 1470 (e.g. the electrical earth potential), and that a gate connection 1465*c* of the field effect transistor 1465 is electrically coupled to a low electrical potential 1470 (e.g. to the earth potential, generally to a potential that is less than or equal to an electrical potential present at the second source/drain connection 1465*b*).

The gate control devices (ESD detector circuits or trigger circuits) 1500*a* to 1500*d* are set up in such a way that, using a fast transient occurring during an ESD pulse, the overshooting of an overvoltage threshold can be detected and/or an RC control can be effected.

The functioning of the gate control devices 1500*a* to 1500*d* shown in FIG. 15A to FIG. 15D is similar to that of the gate control devices 1400*a* to 1400*d* described in connection with FIG. 14A to FIG. 14D; in contrast to the latter, in the case of the gate control devices 1500*a* to 1500*d*, in the first (normal) operating state of the electrical circuit, a high electrical potential is present at the gate connection G2 and at the gate regions of the ESD protection element that are coupled thereto and are formed above n-conducting body regions, with the result that the corresponding PMOS transistors turn off, and the ESD protection element is at high impedance or switched off ("off" state). In the case of an ESD event, clearly the high electrical potential is pulled down (pull-down), and the MOS channel or MOS channels of the PMOS transistors becomes or become conducting. On account of the high voltage drop at the ESD protection element during the ESD pulse, once again an intense MOS current is generated, which triggers the SCR structure of the ESD protection element, with the result that the SCR structure undergoes transition to the low-impedance state ("on" state), and the ESD protection element can dissipate the ESD current.

Although the invention has been shown and described primarily in connection with specific exemplary embodiments, it should be understood by those skilled in the art that diverse changes can be made to the configuration and the details in respect thereof without departing from the essence and scope of the invention as defined by the claims hereinafter. The scope of the invention is therefore determined by the appended claims, and the intention is for all alterations that lie within the scope of the meaning and the range of equivalence of the claims to be encompassed by the claims.

What is claimed is:

1. An ESD protection element for use in an electrical circuit, comprising:
 a fin structure comprising:
  a first connection region having a first conductivity type, a second connection region having a second conductivity type, which is opposite to the first conductivity type, and also
  a plurality of body regions which are formed directly adjacent to one another and which are formed between the first connection region and the second connection region,
  the body regions alternately having the first conductivity type and the second conductivity type, the plurality of body regions comprising a first body region having the second conductivity type and a second body region having the first conductivity type, the first body region having the second conductivity type being formed directly adjacent to the first connection region and between the first connection region and the second body region, the second body region having the first conductivity type being formed directly adjacent to the second connection region and between the first body region and the second connection region, and each body region of the plurality of body regions having a dopant concentration that is lower than a dopant concentration of the first connection region and is lower than a dopant concentration of the second connection region;
 at least one gate region formed on or above at least one of the plurality of body regions; and
 at least one gate control device electrically coupled to the at least one gate region, and the at least one gate control device being configured to control at least one electrical potential applied to the at least one gate region.

2. The ESD protection element according to claim 1, wherein the at least one gate control device is configured to control the at least one electrical potential applied to the at least one gate region such that the ESD protection element has a high electrical resistance during a first operating state of the electrical circuit, and wherein the ESD protection element has a lower electrical resistance during a second operating state of the electrical circuit, the second operating state being characterized by the occurrence of an ESD event.

3. The ESD protection element according to claim 1, wherein at least one of the first connection region,
 the second connection region, and
 at least one of the plurality of body regions contains silicon material.

4. The ESD protection element according to claim 1, wherein the at least one gate region is formed on or above the first body region or the second body region or both body regions.

5. The ESD protection element according to claim 4,
 wherein the at least one gate region comprises a first gate region and a second gate region,
 wherein the at least one gate control device comprises a first gate control device and a second gate control device,
 wherein the first gate region is formed on or above the first body region and is electrically coupled to the first gate control device, and
 wherein the second gate region is formed on or above the second body region and is electrically coupled to the second gate control device.

6. The ESD protection element according to claim 1, the plurality of body regions comprising:
 2m (m∈N, m≧2) body regions formed between the first connection region and the second connection region, in which case it holds true for all k (k∈N, 1≦k≦m) that the (2k−1)-th body region has the second conductivity type, and that the 2k-th body region has the first conductivity type.

7. The ESD protection element according to claim 1, the first connection region being formed as a p-conducting region, and the second connection region being formed as an n-conducting region.

8. The ESD protection element according to claim 7, the at least one gate control device being formed as an ESD detector circuit.

9. The ESD protection element according to claim 8, wherein the first connection region is electrically coupled to a high electrical potential, and the second connection region is electrically coupled to a low electrical potential.

10. The ESD protection element according to claim 8, wherein the first connection region is electrically coupled to a high electrical potential, and the second connection region being electrically coupled to a low electrical potential.

11. The ESD protection element according to claim 9, wherein the first connection region is electrically coupled to an electrical supply voltage or to a voltage-carrying node of the electrical circuit.

12. The ESD protection device for use in an electrical circuit having at least one ESD protection element according to claim 1, which is connected in parallel with at least one element of the electrical circuit that is to be protected against an ESD event.

13. The ESD protection device according to claim 12, having a plurality of ESD protection elements connected in parallel, the ESD protection elements connected in parallel having at least one common gate region.

14. The ESD protection device according to claim 13, further comprising
 a substrate;
 an electrically insulating layer formed on the substrate; and
 the ESD protection device being formed on the electrically insulating layer.

15. The ESD protection device according to claim 14, wherein the substrate is a silicon substrate.

16. The ESD protection device according to claim 14, wherein the electrically insulating layer is an oxide layer.

17. An ESD protection element for use in an electrical circuit comprising:
 a fin structure comprising:
 a first connection region having a first conductivity type, a second connection region having a second conductivity type, which is opposite to the first conductivity type, and also
 $2m$ ($m \in N$, $m \geq 2$) body regions which are formed directly adjacent to one another and which are formed between the first connection region and the second connection region, in which case it holds true for all k ($k \in N$, $1 \leq k \leq m$) that the $(2k-1)$-the body region has the second conductivity type, and that the $2k$-th body region has the first conductivity type,
 the $2m$ body regions comprising a first body region having the second conductivity type and a second body region having the first conductivity type, the first body region being formed between the first connection region and the second body region, the second body region being formed between the first body region and the second connection region, and each body region of the $2m$ body regions having a dopant concentration that is lower than a dopant concentration of the first connection region and is lower than a dopant concentration of the second connection region; and
 a respective gate region formed on or above each of the $2m$ body regions that has the first conductivity type; or
 a respective gate region formed on or above each of the $2m$ body regions that has the second conductivity type; and
 at least one gate control device electrically coupled to the gate region or regions, the at least one gate control device being configured to control at least one electrical potential applied to the gate region or regions.

18. The ESD protection element according to claim 17, the at least one gate control device comprising:
 a first gate control device, which is electrically coupled to those gate regions which are formed on or above a body region having the first conductivity type; or
 a second gate control device which is electrically coupled to those gate regions which are formed on or above a body region having the second conductivity type.

19. The ESD protection element according to claim 17, the at least one gate control device comprising:
 a first gate control device, which is electrically coupled to those gate regions which are formed on or above a body region having the first conductivity type; and
 a second gate control device which is electrically coupled to those gate regions which are formed on or above a body region having the second conductivity type.

20. An ESD protection element for use in an electrical circuit comprising:
 a fin structure comprising:
 a first connection region having a first conductivity type, a second connection region having a second conductivity type, which is opposite to the first conductivity type, and also
 $2m$ ($m \in N$, $m \geq 2$) body regions which are formed directly adjacent to one another and which are formed between the first connection region and the second connection region, in which case it holds true for all k ($k \in N$, $1 \leq k \leq m$) that the $(2k-1)$-th body region has the second conductivity type, and that the $2k$-th body region has the first conductivity type,
 the $2m$ body regions comprising a first body region having the second conductivity type and a second body region having the first conductivity type, the first body region being formed between the first connection region and the second body region, the second body region being formed between the first body region and the second connection region, and each body region of the $2m$ body regions having a dopant concentration that is lower than a dopant concentration of the first connection region and is lower than a dopant concentration of the second connection region; and
 a respective gate region formed on or above each of the $2m$ body regions; and
 at least one gate control device electrically coupled to the gate region or regions, the at least one gate control device being configured to control at least one electrical potential applied to the gate region or regions.

* * * * *